United States Patent
Kalitsov et al.

(10) Patent No.: US 11,349,066 B2
(45) Date of Patent: May 31, 2022

(54) MAGNETIC TUNNEL JUNCTION MEMORY DEVICES EMPLOYING RESONANT TUNNELING AND METHODS OF MANUFACTURING THE SAME

(71) Applicant: SANDISK TECHNOLOGIES LLC, Addison, TX (US)

(72) Inventors: Alan Kalitsov, San Jose, CA (US); Bhagwati Prasad, San Jose, CA (US); Derek Stewart, Livermore, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/081,625

(22) Filed: Oct. 27, 2020

(65) Prior Publication Data

US 2022/0131068 A1    Apr. 28, 2022

(51) Int. Cl.
| | | |
|---|---|---|
| *H01L 43/02* | (2006.01) | |
| *H01L 43/04* | (2006.01) | |
| *H01L 43/06* | (2006.01) | |
| *H01L 43/10* | (2006.01) | |
| *H01L 43/12* | (2006.01) | |

(Continued)

(52) U.S. Cl.
CPC ............ *H01L 43/02* (2013.01); *G11C 11/161* (2013.01); *G11C 11/1673* (2013.01); *G11C 11/1675* (2013.01); *G11C 11/18* (2013.01); *H01L 27/222* (2013.01); *H01L 43/04* (2013.01);

(Continued)

(58) Field of Classification Search
CPC ....... H01L 43/02; H01L 27/222; H01L 43/04; H01L 43/06; H01L 43/10; H01L 43/12; H01L 43/14; G11C 11/161; G11C 11/1673; G11C 11/1675; G11C 11/18
See application file for complete search history.

(56) References Cited

U.S. PATENT DOCUMENTS 9,755,140 B2 * 9/2017 Lim .................... H01L 43/12
9,830,966 B2   11/2017 Mihajlovic et al.
(Continued)

FOREIGN PATENT DOCUMENTS

JP          2005-011907 A    1/2005

OTHER PUBLICATIONS

Kalitsov, A. et al., "Magnetic Tunnel Junction Memory Devices Employing Resonant Tunneling And Methods Of Manufacturing The Same," U.S. Appl. No. 17/081,557, filed Oct. 27, 2020.
(Continued)

*Primary Examiner* — Tri M Hoang
(74) *Attorney, Agent, or Firm* — The Marbury Law Group PLLC

(57) ABSTRACT

A magnetoresistive memory device includes a magnetic tunnel junction including a free layer, at least two tunneling dielectric barrier layers, and at least one metallic quantum well layer. The quantum well layer leads to the resonant electron tunneling through the magnetic tunnel junction in such a way that it strongly enhances the tunneling probability for one of the magnetization states of the free layer, while this tunneling probability remains much smaller in the opposite magnetization state of the free layer. The device can be configured in a spin transfer torque device configuration, a voltage-controlled magnetic anisotropy, a voltage controlled exchange coupling device configuration, or a spin-orbit-torque device configuration.

20 Claims, 13 Drawing Sheets

(51) Int. Cl.

| | |
|---|---|
| H01L 43/14 | (2006.01) |
| H01L 27/22 | (2006.01) |
| G11C 11/18 | (2006.01) |
| G11C 11/16 | (2006.01) |

(52) U.S. Cl.
CPC .............. *H01L 43/06* (2013.01); *H01L 43/10* (2013.01); *H01L 43/12* (2013.01); *H01L 43/14* (2013.01)

(56) References Cited

U.S. PATENT DOCUMENTS

| | | | |
|---|---|---|---|
| 10,229,723 | B1 | 3/2019 | Choi et al. |
| 10,290,337 | B2 | 5/2019 | Mihajlovic et al. |
| 10,354,710 | B2 | 7/2019 | Petti et al. |
| 10,381,551 | B1 | 8/2019 | Lille |
| 10,516,098 | B2 | 12/2019 | Sayed et al. |
| 10,522,746 | B1* | 12/2019 | Sundar .................. G11C 11/161 |
| 10,726,892 | B2 | 7/2020 | Le et al. |
| 10,788,547 | B2 | 9/2020 | Kalitsov et al. |
| 10,797,225 | B2* | 10/2020 | Sundar .................. G11C 11/161 |
| 10,797,227 | B2 | 10/2020 | Le et al. |
| 10,811,596 | B2 | 10/2020 | Le et al. |
| 10,964,468 | B2 | 3/2021 | Salahuddin et al. |
| 10,978,234 | B2* | 4/2021 | Chatterjee ........... H01F 10/3254 |
| 11,183,227 | B1 | 11/2021 | Wang et al. |
| 2019/0027201 | A1 | 1/2019 | Petti et al. |
| 2019/0080738 | A1 | 3/2019 | Choi et al. |
| 2019/0109277 | A1 | 4/2019 | Jan et al. |
| 2019/0305040 | A1 | 10/2019 | Jeong et al. |
| 2020/0006633 | A1 | 1/2020 | Lille |
| 2021/0159389 | A1* | 5/2021 | Reznicek ................ H01L 43/02 |
| 2021/0159393 | A1 | 5/2021 | Law et al. |
| 2021/0175416 | A1 | 6/2021 | Jeong et al. |
| 2021/0288242 | A1* | 9/2021 | Yogendra ................ H01L 43/12 |

OTHER PUBLICATIONS

Kalitsov, A. et al., "Magnetic Tunnel Junction Memory Devices Employing Resonant Tunneling And Methods Of Manufacturing The Same," U.S. Appl. No. 17/081,678, filed Oct. 27, 2020.
Belmoubarik, M. et al., "MgAl2O4(001) based magnetic tunnel junctions made by direct sputtering of a sintered spinel target," Appl. Phys. Lett. 108, 132404 (2016); https://doi.org/10.1063/1.4945049.
Chen, C. H. et al., "Ultrahigh Tunnel Magnetoresistance Using an Artificial Superlattice Barrier with Copper and Aluminum Oxide," EPL Journal, vol. 111, 47005-1 to 47005-5, (2015) doi: 10.1209/0295-5075/111/47005.
Koo, J. et al., "Interface perpendicular magnetic anisotropy in Fe/MgAl2O4 layered structures," Phys. Status Solidi RRL 8, No. 10, 841-844 (2014) / DOI 10.1002/pssr.201409340.
Pesic, M. et al., "Built-In Bias Generation in Anti-Ferroelectric Stacks: Methods and Device and Applications," Journal of The Electron Devices Society, vol. 6, pp. 1019-1025, (2018) *Digital Object Identifier* 10.1109/JEDS.2018.2825360.
Scheike, T. et al., "Chemical ordering and large tunnel magnetoresistance in Co2FeAl/MgAl2O4/Co2FeAl(001) junctions," Applied Physics Express 9, 053004 (2016), http://doi.org/10.7567/APEX.9.053004.
Sukegawa, H. et al., "Perpendicular magnetic anisotropy at lattice-matched Co2FeAl/MgAl2O4(001) epitaxial interfaces," Appl. Phys. Lett. 110, 112403 (2017); https://doi.org/10.1063/1.4973683.
Tao, B. et al., "Transport Properties in Sputtered CoFeB/MgAl2O4/CoFeB Magnetic Tunnel Junctions," IEEE Transactions on Magnetics, vol. 50, No. 11, Nov. 2014.
Theodonis, I. et al., "Enhancing Spin-Transfer Torque Through the Proximity of Quantum Well States," The American Physical Society, Physical Review B., vol. 76, 224406, (2007).
Xiang, Q. et al., "Realizing Room-Temperature Resonant Tunnel Magnetoresistance in Cr/Fe/MgAl2O4 Quasi-Quantum Well Structures," *Adv. Sci.* 2019, vol. 6, 1901438, (2019), DOI: 10.1002/advs.201901438.
Zhang, J. et al., "Spinel oxides: spin-filter barrier for a class of magnetic tunnel junctions," Appl. Phys. Lett. 100, 222401 (2012); doi: 10.1063/1.4722804, View online: https://doi.org/10.1063/1.4722804.
U.S. Appl. No. 16/212,342, filed Dec. 6, 2018, SanDisk Technologies LLC.
U.S. Appl. No. 16/401,172, filed May 2, 2019, Western Digital Technologies, Inc.
U.S. Appl. No. 16/442,858, filed Jun. 17, 2019, Western Digital Technologies, Inc.
U.S. Appl. No. 16/558,552, filed Sep. 3, 2019, Western Digital Technologies, Inc.
U.S. Appl. No. 16/661,210, filed Oct. 23, 2019, Western Digital Technologies, Inc.
U.S. Appl. No. 16/666,967, filed Oct. 29, 2019, SanDisk Technologies LLC.
U.S. Appl. No. 16/686,860, filed Nov. 18, 2019, SanDisk Technologies LLC.
U.S. Appl. No. 16/686,917, filed Nov. 18, 2019, SanDisk Technologies LLC.
U.S. Appl. No. 16/692,027, filed Nov. 22, 2019, SanDisk Technologies LLC.
U.S. Appl. No. 16/692,903, filed Nov. 22, 2019, Western Digital Technologies, Inc.
U.S. Appl. No. 16/692,965, filed Nov. 22, 2019, Western Digital Technologies, Inc.
U.S. Appl. No. 16/693,006, filed Nov. 22, 2019, Western Digital Technologies, Inc.
U.S. Appl. No. 16/781,225, filed Feb. 4, 2020, Western Digital Technologies, Inc.
U.S. Appl. No. 16/824,814, filed Mar. 20, 2020, Western Digital Technologies, Inc.
U.S. Appl. No. 16/853,407, filed Apr. 20, 2020, Western Digital Technologies, Inc.
U.S. Appl. No. 16/853,440, 04-202-2020, Western Digital Technologies, Inc.
U.S. Appl. No. 16/880,393, filed May 21, 2020, SanDisk Technologies LLC.
U.S. Appl. No. 16/880,497, filed May 21, 2020, SanDisk Technologies LLC.
U.S. Appl. No. 16/910,799, filed Jun. 24, 2020, SanDisk Technologies LLC.
U.S. Appl. No. 16/944,758, filed Jul. 31, 2020, Western Digital Technologies, Inc.
U.S. Appl. No. 16/944,826, filed Jul. 31, 2020, Western Digital Technologies, Inc.
U.S. Appl. No. 17/004,534, filed Aug. 27, 2020, Western Digital Technologies, Inc.
U.S. Appl. No. 17/004,690, filed Aug. 27, 2020, Western Digital Technologies, Inc.
Notification of Transmittal of the International Search Report and the Written Opinion of the International Searching Authority for International Patent Application No. PCT/US2021/036136, dated Dec. 9, 2021, 13 pages.
Invitation to Pay Additional Fees and, Where Applicable, Protest Fees, and Communication Relating to the Results of the Partial International Search for International Patent Application No. PCT/US2021/036136, dated Nov. 3, 2021, 5 pages.
Yuasa, S. et al., "Materials for spin-transfer-torque magnetoresistive random-access memory," MRS Bulletin, vol. 43, pp. 352-357, (2018); DOI: https://doi.org/10.1557/mrs.2018.93.
USPTO Office Communication, Ex Parte Quayle Office Action, for U.S. Appl. No. 17/081,678, dated Dec. 7, 2021, 16 pages.
USPTO Office Communication, Non-Final Office Action, for U.S. Appl. No. 17/081,557, dated Dec. 20, 2021, 37 pages.

* cited by examiner

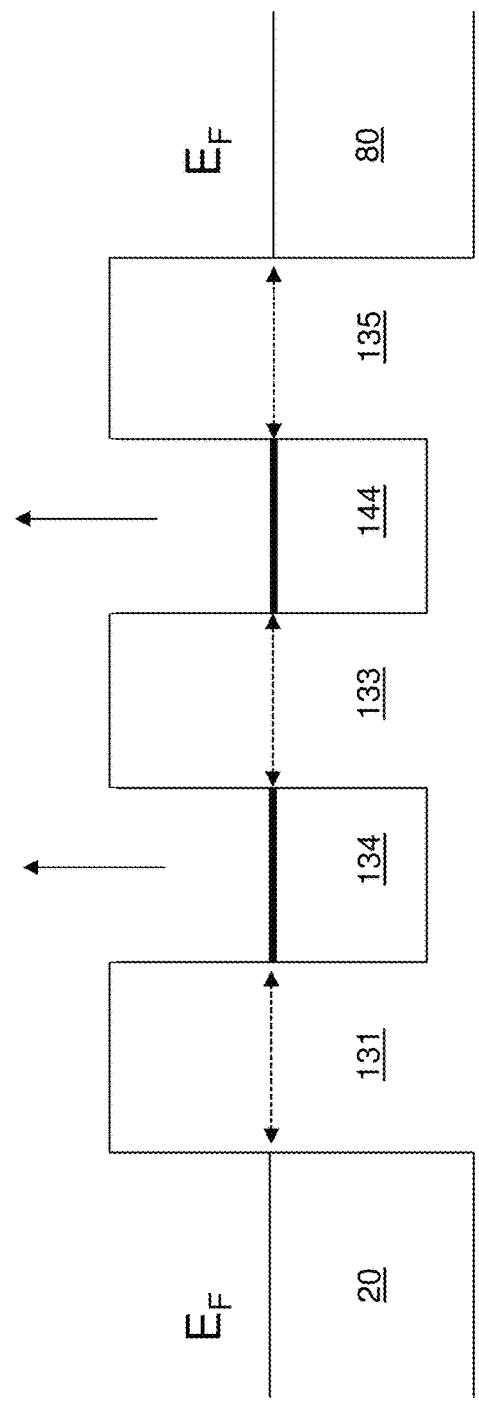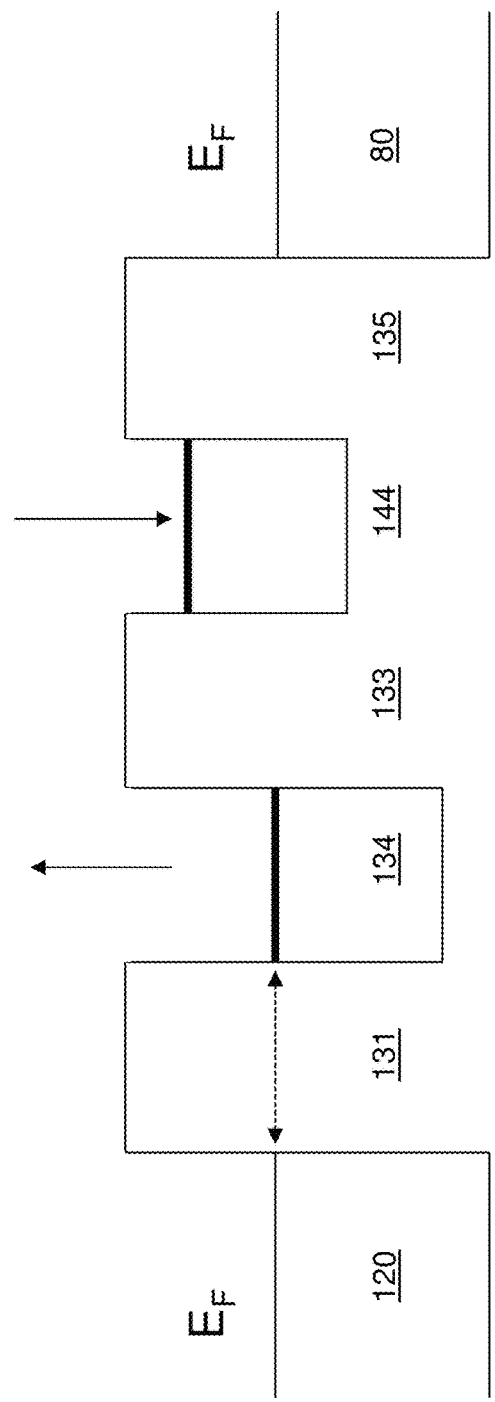

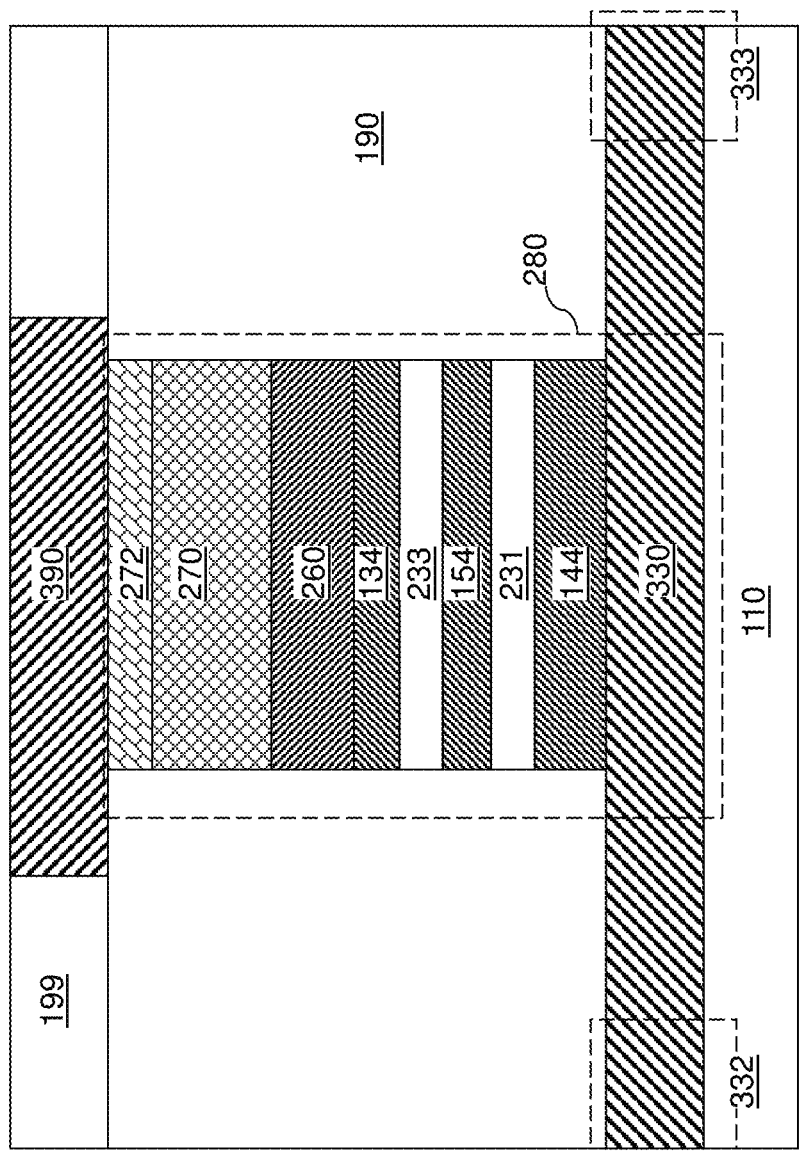

MAGNETIC TUNNEL JUNCTION MEMORY DEVICES EMPLOYING RESONANT TUNNELING AND METHODS OF MANUFACTURING THE SAME

FIELD

The present disclosure relates generally to the field of magnetic (e.g., spintronic) memory devices, and specifically to magnetic tunnel junction memory devices employing resonant electron tunneling, methods of operating the same, and methods of manufacturing the same.

BACKGROUND

A magnetoresistive memory device can store information employing the difference in electrical resistance of a first configuration in which a ferromagnetic free layer has a magnetization direction that is parallel to the magnetization of a ferromagnetic reference layer and a second configuration in which the free layer has a magnetization direction that is antiparallel to the magnetization of the reference layer. Programming of the magnetoresistive memory device requires flipping of the direction of the magnetization of the free layer employing various external power sources, which may be magnetic in nature or may employ a spin transfer mechanism.

SUMMARY

According to one embodiment of the present disclosure, a magnetoresistive memory device comprises a first electrode, a second electrode, and a magnetic tunnel junction located between the first electrode and the second electrode. The magnetic tunnel junction comprises a ferromagnetic reference layer, a ferromagnetic free layer, a first tunneling dielectric layer located between one of the reference layer or the free layer, and one of the first electrode of the second electrode, and a second tunneling dielectric layer located between the reference layer and the free layer. At least one of the reference layer or the free layer comprises a quantum well.

According to one embodiment of the present disclosure, a magnetoresistive memory device comprises a first electrode, a second electrode, and a magnetic tunnel junction located between the first electrode and the second electrode. The magnetic tunnel junction comprises an iron or Heusler alloy ferromagnetic reference layer, an iron or Heusler alloy ferromagnetic free layer, a (001) textured magnesium oxide first tunneling dielectric layer located between one of the reference layer or the free layer, and one of the first electrode of the second electrode, and a (001) textured $MgAl_2O_4$ second tunneling dielectric layer located between the reference layer and the free layer.

According to another embodiment of the present disclosure, a method of forming a magnetoresistive memory device comprises forming a first electrode over a substrate, depositing a magnetic tunnel junction layer stack over the first electrode, wherein the magnetic tunnel junction layer stack comprises, from one side to another, a first texture-breaking nonmagnetic layer including a first nonmagnetic transition metal, a magnesium oxide first tunneling dielectric layer including grains having (001) texture, a reference layer including a first amorphous ferromagnetic material, a spinel second dielectric tunneling layer including an amorphous spinel material, a free layer including a second amorphous ferromagnetic material, a magnesium oxide third tunneling dielectric layer including grains having (001) texture, and a second texture-breaking nonmagnetic layer including a second nonmagnetic transition metal, performing an anneal process to induce solid phase epitaxy crystallization of materials of the free layer, the second tunneling dielectric layer, and the reference layer using at least one of the first or the third tunneling dielectric layer as a crystallization template layer, to convert the amorphous spinel material of the second tunneling dielectric layer into polycrystalline spinel material having (001) texture along an axial direction that is perpendicular to an interface between the second tunneling dielectric layer and the free layer, and forming a second electrode over a portion of the magnetic tunnel junction layer stack prior to or after the anneal process.

According to yet another embodiment of the present disclosure, a magnetoresistive memory device comprises a voltage controlled exchange coupling layer stack comprising a perpendicular magnetic anisotropy (PMA) ferromagnetic layer having a fixed magnetization direction, a ferromagnetic free layer, and an electrically conductive nonmagnetic interlayer exchange coupling layer located between the free layer and the PMA ferromagnetic layer and providing voltage dependent exchange coupling between the free layer and the PMA ferromagnetic layer, a magnetic tunnel junction comprising a ferromagnetic reference layer, a first tunneling dielectric layer, a second tunneling dielectric layer, and a metallic quantum well layer located between the first and the second tunneling dielectric layers, wherein the magnetic tunnel junction also includes the free layer, a first electrode located on a first side of a combination of the voltage controlled exchange coupling layer stack and the magnetic tunnel junction, and a second electrode located on a second side of the combination of the voltage controlled exchange coupling layer stack and the magnetic tunnel junction.

According to another embodiment of the present disclosure, a spin-orbit-torque (SOT) magnetoresistive memory device comprises a magnetic tunnel junction comprising, from one side to another, a ferromagnetic free layer, a first tunneling dielectric layer, a metallic quantum well layer, a second tunneling dielectric layer, and ferromagnetic reference layer, a first electrode located on the reference layer side the magnetic tunnel junction, a spin Hall effect metal line contacting a surface of the free layer, a first electrical contact electrically contacting a first end of the spin Hall effect metal line, and a second electrical contact electrically contacting a second end of the spin Hall effect metal line.

BRIEF DESCRIPTION OF THE DRAWINGS

FIG. 2A is an energy band diagram during a resonant tunneling through a magnetic tunnel junction of embodiments of the present disclosure.

FIG. 2B is an energy band diagram during a non-resonant tunneling through a magnetic tunnel junction of embodiments of the present disclosure.

FIG. 6A is a vertical cross-sectional view of a first configuration of an exemplary spin-orbit-torque magnetoresistive memory device according to a third embodiment of the present disclosure.

DETAILED DESCRIPTION

Figure 1:
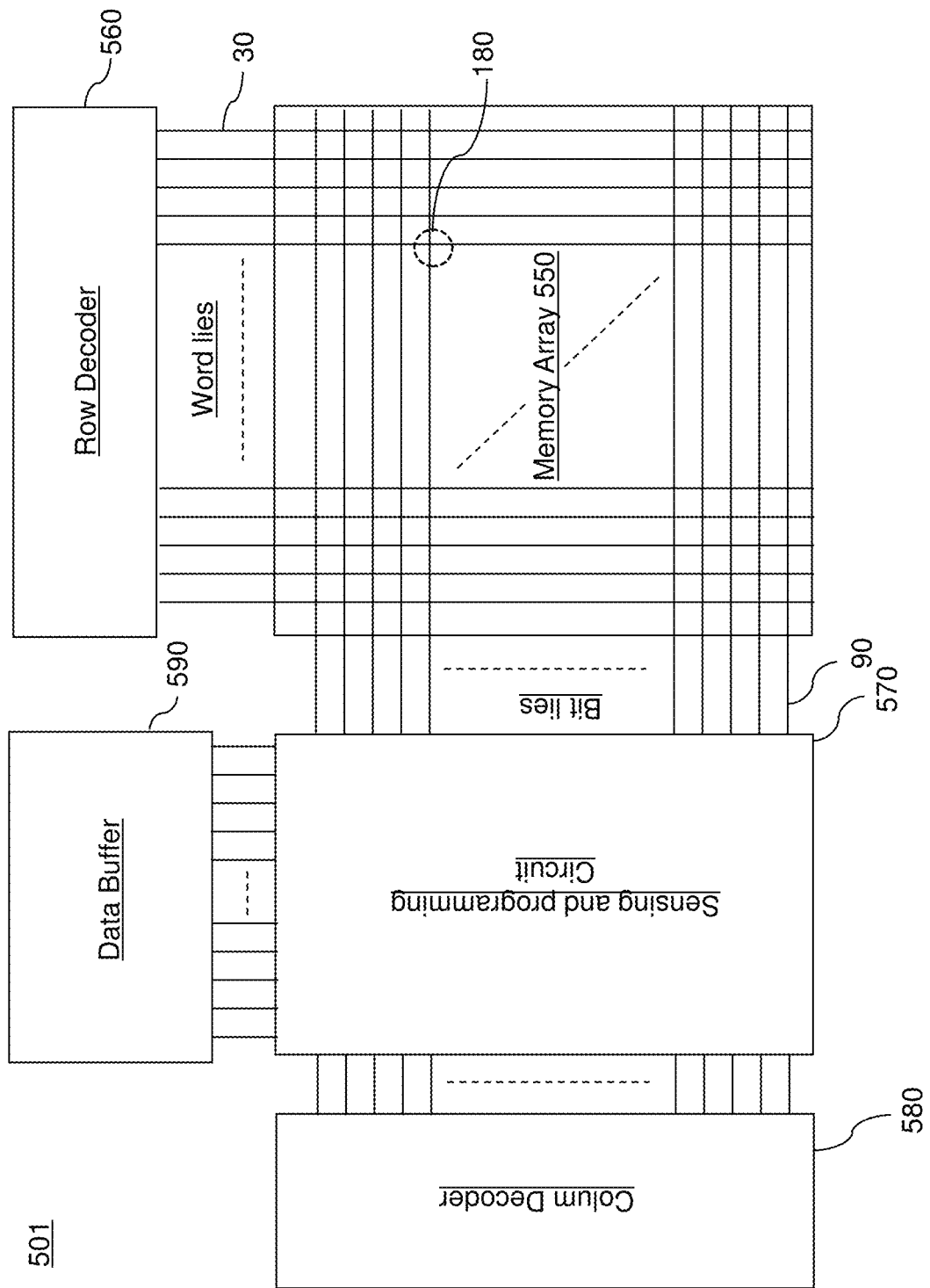
FIG. 1 is a schematic diagram of a random access memory array of magnetic tunnel junction devices according to embodiments of the present disclosure.

Embodiments of the present disclosure are directed to magnetic tunnel junction memory devices employing resonant tunneling, methods of operating the same, and methods of manufacturing the same, the various aspects of which are described in detail herebelow.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow. As used herein, a "layer stack" refers to a stack of layers. As used herein, a "line" or a "line structure" refers to a layer that has a predominant direction of extension, i.e., having a direction along which the layer extends the most. As used herein, a "ferromagnetic material" refers to any material that exhibits spontaneous ferromagnetic polarization that can be reversed by the application of an external magnetic and/or electric field (e.g., exhibits ferromagneticity).

FIG. 1 is a schematic diagram of a magnetoresistive random access memory (MRAM) device 501 including a two-dimensional array of magnetoresistive memory devices 180 according to an embodiment of the present disclosure. As used herein, a "random access memory device" refers to a memory device including memory cells that allow random access, i.e., access to any selected memory cell upon a command for reading the contents of the selected memory cell.

The random access memory device 501 of the embodiments of the present disclosure may comprise an MRAM device. The device 501 includes a memory array region 550 containing an array of respective magnetic devices, such as magnetic tunnel junction devices (e.g., magnetoresistive memory cells) 180 located at intersections of word lines (which may comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). For example, the first electrically conductive lines 30 may be electrically connected to, and/or may comprise, bottom electrodes of a respective row of magnetoresistive memory devices 180 in the memory array region 550, while the second electrically conductive lines 90 may be electrically connected to, and/or may comprise, top electrodes of a respective column of magnetoresistive memory devices 180 in the memory array region 550.

The random access memory device 501 may also contain a row decoder 560 connected to the word lines, a sensing and programming circuit 570 (which may include sense amplifiers, programming transistors, and control circuits) connected to the bit lines, a column decoder 580 connected to the bit lines, and a data buffer 590 connected to the sense circuitry. The magnetoresistive memory devices 180 are provided in an array configuration that forms the random access memory device 501. In one embodiment, the magnetoresistive memory devices 180 may be provided as a rectangular array. As such, each of the magnetoresistive memory devices 180 can be a two-terminal device including a respective first electrode and a respective second electrode. It should be noted that the location and interconnection of elements are schematic, and the elements may be arranged in a different configuration. Further, a magnetoresistive memory device 180 may be manufactured as a discrete device, i.e., a single isolated device.

The random access configuration illustrated in the random access memory device 501 is only exemplary, and the magnetoresistive memory devices 180 of the embodiments of the present disclosure can be connected in different interconnection configurations.

Referring to FIGS. 2A and 2B, energy band diagrams are shown for a magnetic tunnel junction within an exemplary magnetoresistive memory device 180 of an embodiment of the present disclosure. The magnetoresistive memory device 180 can include, from one side to another, a first metallic contact layer 20, a first tunneling dielectric layer 131, a ferromagnetic reference layer 134, a second tunneling dielectric layer 133, a ferromagnetic free layer 144, a third tunneling dielectric layer 135, and a second metallic contact layer 80. According to an aspect of the present disclosure, each of the reference layer 134 and the free layer 144 can be thin enough to have discrete (quantized) energy levels as a respective two-dimensional quantum well. For example, each of the reference layer 134 and the free layer 144 can have a respective thickness that corresponds to an integer number of monolayers. The integer number may be, for example, in a range from 1 to 5. Preferably, each of the reference layer 134 and the free layer 144 are one, two or three monolayers thick. For example, each of the reference layer 134 and the free layer 144 can have a respective thickness in a range from 0.3 nm to 2 nm, such as 0.5 nm to 2 nm, although a greater thickness may also be employed. Optionally, each of the reference layer 134 and the free layer 144 is thinner than at least one of the tunneling dielectric layers (131, 133, 135). The tunneling dielectric layers act as energy barriers to the reference layer 134 and the free layer 144 which function as quantum wells.

According to an aspect of the present disclosure, discrete energy levels (i.e., quantum well resonant states) of the reference layer 134 and the free layer 144 within the magnetoresistive memory device 180 between the first metallic contact layer 20 and the second metallic contact layer 80 can have matched energy levels that are within 0.1 eV from the Fermi energy level ($E_F$) of the first metallic contact layer 20 and/or the second metallic contact layer 80. This energy level matching leads to resonant tunneling through the magnetoresistive memory device 180 upon application of a current or voltage between the first metallic contact layer 20 and the second metallic contact layer 80 when the magnetization of the free layer 144 is parallel to the magnetization of the reference layer 134. In contrast, when the magnetization of the free layer 144 is antiparallel to the magnetization of the reference layer 134, the energy level (i.e., resonant state) of the free layer is not matched to either energy level (i.e., resonant state) of the reference layer 134 or the Fermi energy level of the contact layers (20, 80). In this state, resonant tunneling through the magnetoresistive memory device 180 is inhibited or prevented by the free layer 144 (i.e., the resonant tunneling through the reference layer 134 stops at the free layer 144).

The difference in the energy levels of the parallel state and the antiparallel state of the free layer 144 is large enough such that resonant tunneling does not occur while the free layer 144 is in the antiparallel state relative to the reference layer 144. In the illustrated example of FIGS. 2A and 2B, the resonant tunneling (shown by the dashed arrows) occurs between the first metallic contact layer 20 and the second metallic contact layer 80 while the magnetization of the free layer 144 is in the parallel state to the fixed magnetization direction of the reference layer 134. However, the resonant tunneling does not occur while the free layer 144 is in the antiparallel state to the fixed magnetization direction of the reference layer 134. In the antiparallel state, the free layer 144 has an energy level (i.e., resonant state) which differs by more than 0.1 eV from the Fermi energy level of the first metallic contact layer 20 and/or the second metallic contact layer 80. For example, as shown in FIG. 2B, the energy level of the free layer 144 is more than 0.1 eV higher than the Fermi energy level, which inhibits resonant tunneling through the device 180 between the first metallic contact layer 20 and the second metallic contact layer 80.

Resonant tunneling, or resonant electron tunneling, refers to a quantum phenomenon in which electrons tunnel through the quantum well state formed in the conductive metallic layer(s) between the insulating barriers.

Resonant tunneling significantly increases the tunneling current through a tunnel junction structure. Tunneling magnetoresistance ratio (TMR), which is defined as the ratio of a magnetoresistance of a higher resistance state to a magnetoresistance of a lower resistance state, can be significantly increased if the lower resistance state corresponds to a state having resonant tunneling and if the higher resistance state corresponds to a state without resonant tunneling.

Without wishing to be bound by a particular theory, the present inventors realized that generally, a thicker insulating barrier (i.e., tunneling dielectric layer) strongly increases the tunneling magnetoresistance ratio. The table below shows a result of tight binding calculations of TMR in triple barrier magnetic tunnel junction (MTJ) that consists of three MgO barrier layers (131, 133, 135) and Fe reference and free layers (i.e., a MgO/Fe/MgO/Fe/MgO structure shown in FIGS. 2A and 2B) coupled to two non-magnetic electrodes (20, 80).

| Number of monolayers in tunneling dielectric layers (1341, 133, 135) | $I_P^\uparrow$ (A/cm$^2$) | $I_P^\downarrow$ (A/cm$^2$) | $I_{AP}^\uparrow$ (A/cm$^2$) | $I_{AP}^\downarrow$ (A/cm$^2$) | TMR (%) |
|---|---|---|---|---|---|
| 131 = 1, 133 = 1, 135 = 1 | 1.15E+04 | 2.35 | 8.87E+01 | 8.76E+01 | 6,423 |
| 131 = 2, 133 = 2, 135 = 2 | 1.21E+02 | 1.46E−04 | 2.41E−02 | 2.37E−02 | 252,564 |
| 131 = 2, 133 = 4, 135 = 2 | 5.57 | 2.38E−07 | 1.69E−05 | 1.65E−05 | 16,642,093 |

Results of calculations shown in the above table correspond to the case when spin dependent resonance state for spin-up electrons is close to the Fermi level, while the state for spin-down electrons is away from the Fermi level. As a result, the tunneling current for spin-up electrons at parallel configuration dominates, leading to higher TMR. Thicker tunneling dielectric layers (i.e., potential barriers) (131, 133,

135) strongly increase this effect, since transmission probability through the resonant state becomes much higher compared to transmission probability without the resonant state. As can be seen in the third row of the above table, when the tunneling dielectric layers 131, 133 and 135 have a thickness of two, four and two monolayers, respectively, the TRM value is over sixteen million. In contrast, when each tunneling dielectric layer has a thickness of one monolayer, the TMR value is less than ten thousand.

Figure 3A:
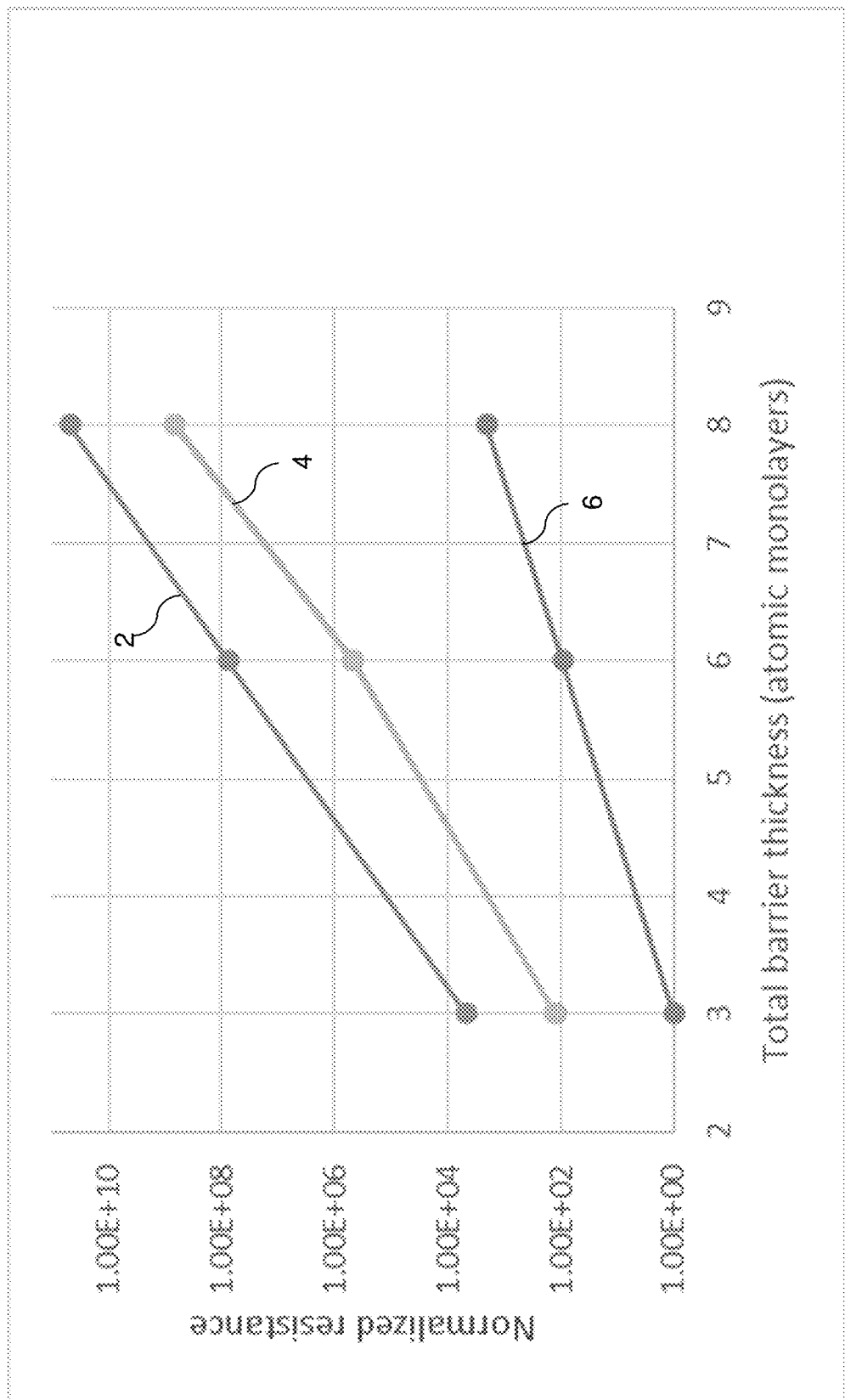
FIG. 3A is plot of calculated normalized resistance versus dielectric barrier layer thickness in units of atomic monolayers according to embodiments of the present disclosure.

However, a thicker insulating barrier also increases a resistance-area product (RA). Without wishing to be bound by a particular theory, the present inventors determined that the resistance-area product increases much slower with the barrier thickness in case of resonant tunneling compared to non-resonant tunneling, as shown in FIG. 3A. Line 2 corresponds to the contribution of spin down electrons into the tunneling current for the case where the magnetization directions of the reference layer 134 and the free layer 144 are parallel. In this case the layers have energy levels (i.e., resonant states) which are not matched to the Fermi energy level of the electrodes (i.e., the first metallic contact layer 20 and the second metallic contact layer 80). Line 4 corresponds to the case shown in FIG. 2B where the magnetization directions of the reference layer 134 and the free layer 144 are antiparallel to each other, and an energy level (i.e., resonant state) of one of these layers is not matched to the Fermi energy level of the electrodes. Line 6 indicates the contribution of spin-up electrons into the tunneling current corresponding to the case shown in FIG. 2A where the magnetization directions of the reference layer 134 and the free layer 144 are parallel. In this case these layers have energy levels (i.e., resonant states) which are matched to the Fermi energy level of the electrodes (i.e., the first metallic contact layer 20 and the second metallic contact layer 80).

During non-resonant tunneling, electrons can tunnel through a multiple energy barrier structures through consecutive tunneling through each energy barrier. Tunneling through each energy barrier is governed by independent tunneling probabilities. The resistance-area produce increases exponentially with the total energy barrier thickness. In contrast, during resonant tunneling, the tunneling resistance is not equal to the sum of individual resistances since the electron transport through multiple barriers becomes an entire quantum tunneling event. Typically, the overall resistance-area product increases by approximately 4 orders of magnitude when the thicknesses of all barrier layers double for non-resonant tunneling. The overall resistance-area product increases by approximately 2 orders of magnitude when the thickness of all barrier layers double for resonant tunneling.

Figure 3B:
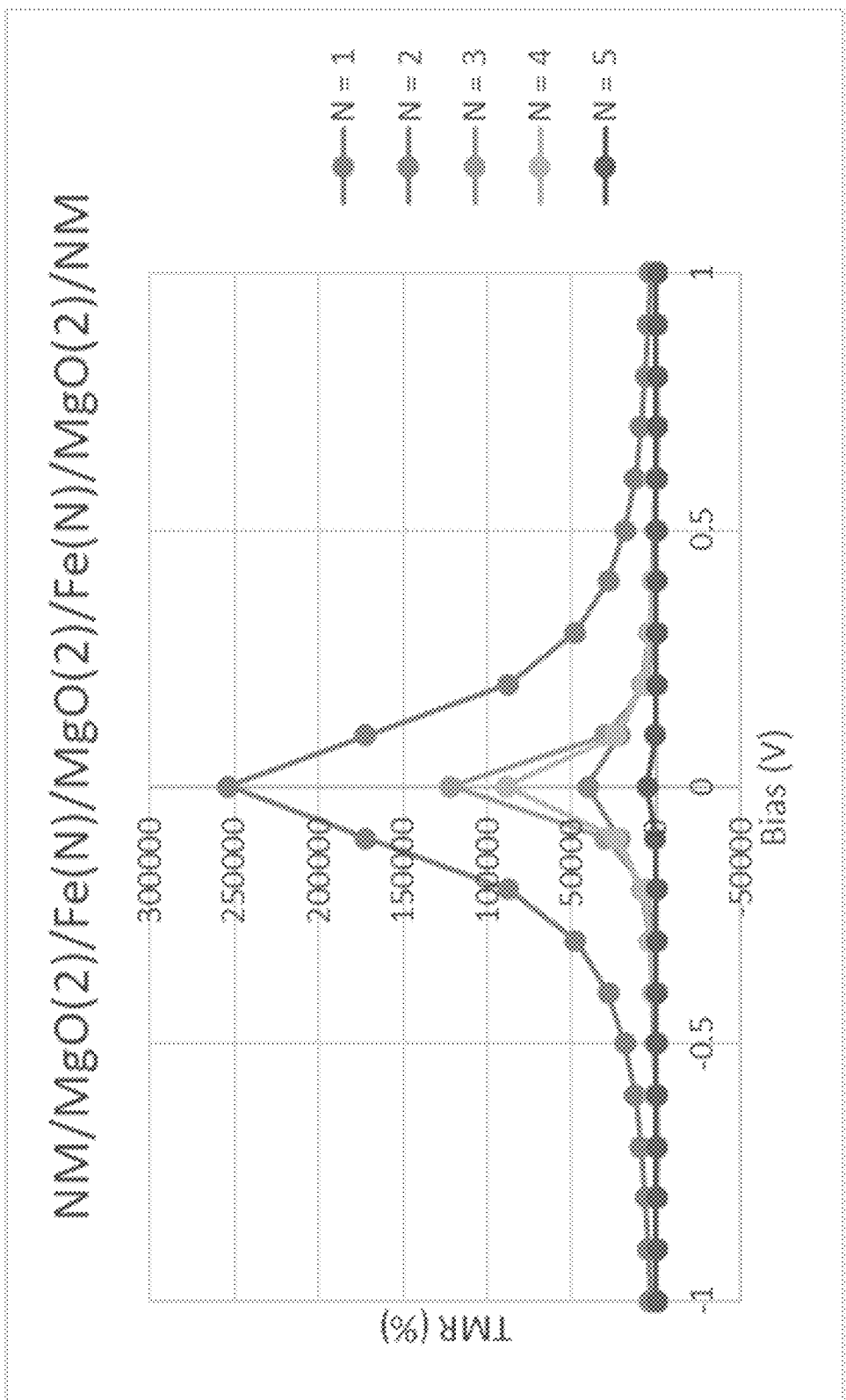
FIG. 3B is plot of calculated tunneling magnetoresistance ratios of resonant magnetic tunnel junction devices as a function of an applied voltage for different thicknesses of a metallic quantum well layer according to embodiments of the present disclosure.

Referring to FIG. 3B, calculated tunneling resistance ratios of resonant magnetic tunnel junction devices of the present disclosure are illustrated as a function of an applied bias voltage. Different curves correspond to different thicknesses of ferromagnetic quantum well layers, which may be a reference layer 134 and a free layer 144. The tunneling dielectric layers 131, 133, 135 comprise two monolayer thick MgO layers in each case. The device 180 TMR increases significantly from 5,500% for five monolayer thick reference and free layers to 250,000% for one monolayer thick reference and free layers. In other words, the TMR of the device 180 may be at least 100,000%, such as 200,000% to 16,642,093%.

Thus, in one embodiment of the present disclosure, the device 180 includes two or more tunneling dielectric layers (i.e., potential barriers), such as three tunneling dielectric layers (131, 133, 135). Optionally, at least one of the two or more tunneling dielectric layers is thicker than each of the reference layer 134 and the free layer 144, for some ferromagnetic reference and free layer materials, such as iron. In this optional embodiment, each of the two or more, such as each of the three tunneling dielectric layers (131, 133, 135) is thicker than each of the reference layer 134 and the free layer 144. In one embodiment, at least one of the two or more tunneling dielectric layers is at least 50%, such as at least 100% (i.e., at least two times), including two to five time thicker than each of the reference layer 134 and the free layer 144. In one embodiment, each of the two or more, such as each of the three tunneling dielectric layers (131, 133, 135) is at least 50%, such as at least 100% (i.e., at least two times), including two to five time thicker than each of the reference layer 134 and the free layer 144. However, in other embodiments, the reference and free layers may be thicker than the tunneling dielectric layers depending on the specific materials and other conditions.

Figure 4A:
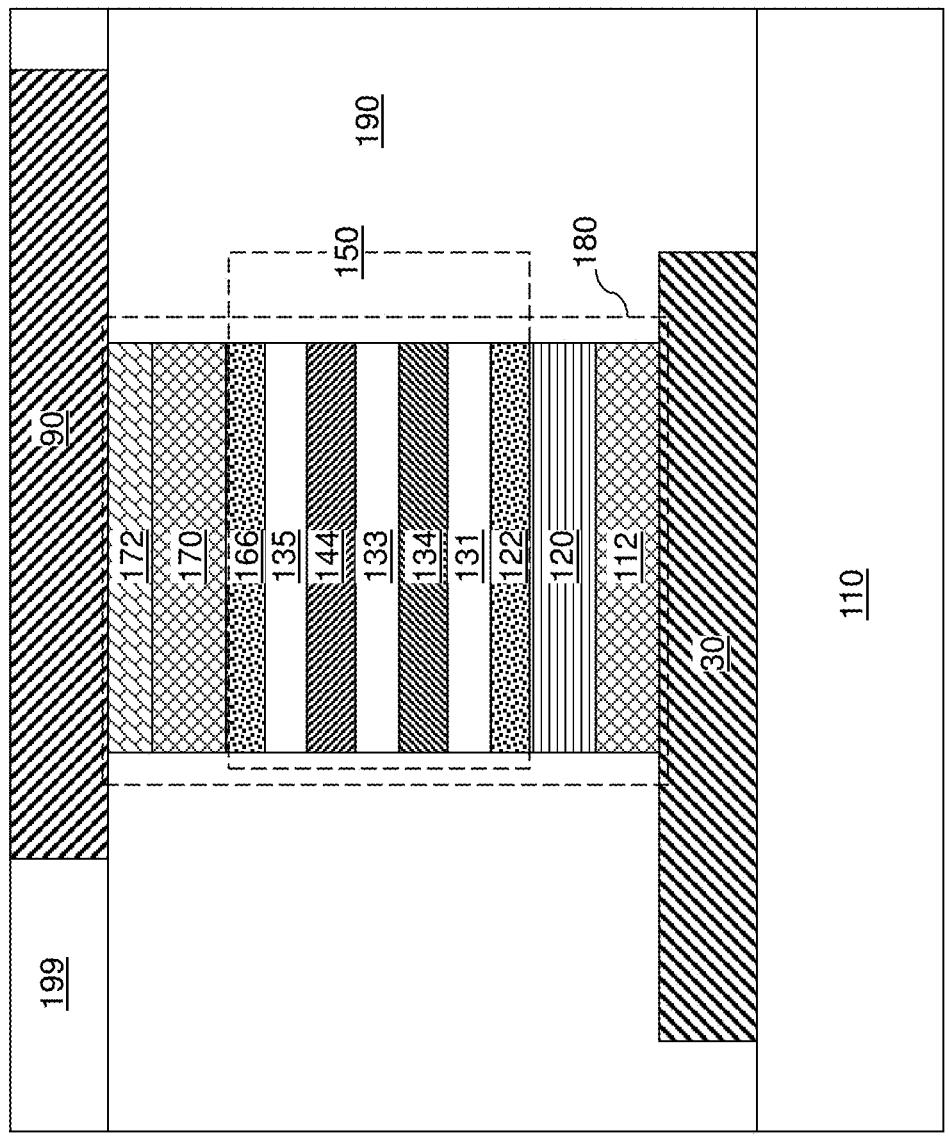
FIG. 4A is a vertical cross-sectional view of a first configuration of an exemplary spin transfer torque magnetoresistive memory device according to a first embodiment of the present disclosure.
Figure 4B:
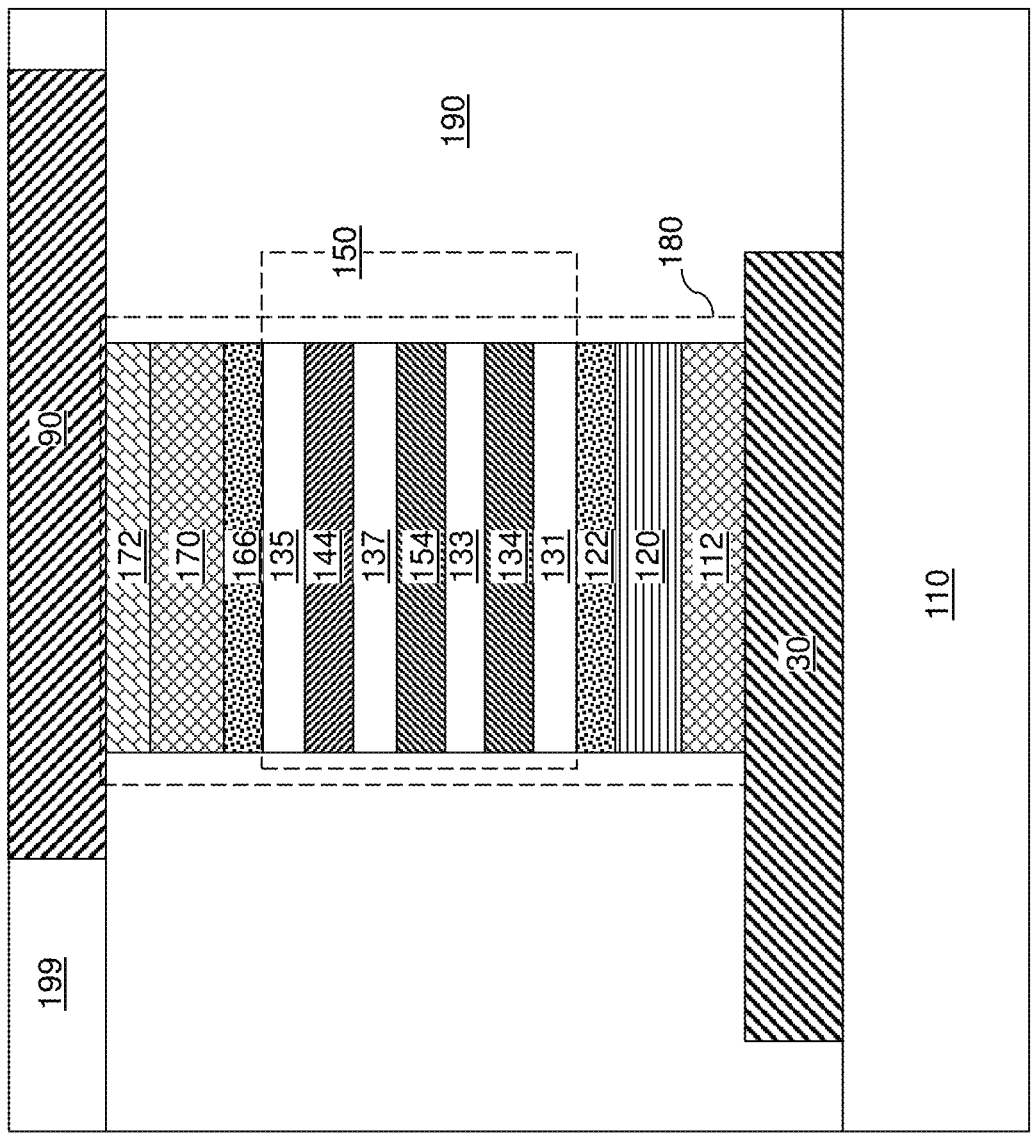
FIG. 4B is a vertical cross-sectional view of a second configuration of an exemplary spin transfer torque magnetoresistive memory device according to the first embodiment of the present disclosure.

Referring to FIGS. 4A and 4B, an exemplary spin transfer torque ("STT") magnetoresistive memory device according to a first embodiment of the present disclosure is illustrated. The illustrated magnetoresistive memory device 180 of FIGS. 4A and 4B may be a STT magnetoresistive memory cell within the array of magnetoresistive memory devices 180 illustrated in FIG. 1. Each of the magnetoresistive memory devices 180 can be formed over a substrate. In an illustrative example, the substrate may comprise a combination of a semiconductor substrate (not expressly shown), semiconductor devices (e.g., driver circuit devices, such as field effect transistors, resistors, diodes, capacitors, etc.) for operating the array of magnetoresistive memory devices 180 to be formed thereupon, and dielectric material layers (not expressly shown) embedding metal interconnect structures (not expressly shown) and overlying the semiconductor devices. The metal interconnect structures can provide electrical connection between nodes of the semiconductor devices in the substrate, and can be configured to provide electrical connection to the array of magnetoresistive memory devices 180 through first electrically conductive lines 30 and second electrically conductive lines 90.

In an alternative configuration in which each magnetoresistive memory device 180 is a discrete memory cell which is individually addressed by a dedicated steering (i.e., selector) element (e.g., access transistor, diode or Ovonic threshold switch device, of which the number can be the same as the number magnetoresistive memory devices 180), a pair of dedicated electrically conductive paths that are not shared with other magnetoresistive memory devices 180 can contact the first electrode 112 and the second electrode 170. While not illustrated in the drawings, the steering (i.e., selector) element may be inserted between a magnetoresistive memory device 180 and one of the access lines (30 or 90). Generally, the illustrated magnetoresistive memory device 180 of FIG. 4A can be incorporated into any circuit setting that enable detection of tunneling magnetoresistance.

In case first electrically conductive lines 30 and second electrically conductive lines 90 are used as access lines (e.g., bit lines and word lines), a lower set of access lines (which may be the first electrically conductive lines 30 or the second electrically conductive lines 90 depending on the configuration) may be formed on, or within, a lower-level dielectric layer 110. Lines 30 may comprise word lines and lines 90 may comprise bit lines or vice-versa. A material layer stack can be deposited over the top surface of the lower-level dielectric layer 110, and can be patterned to form a two-dimensional array of magnetoresistive memory devices 180. A memory-level dielectric layer 190 can be formed around the two-dimensional array of magnetoresistive memory devices 180, and can be planarized to provide a horizontal top surface that is planar with the top surfaces of the magnetoresistive memory devices 180. An upper-level dielectric layer 199 embedding an upper set of access lines can be formed. In one embodiment, the lower set of access lines can be first electrically conductive lines 30 and the upper set of access lines can be second electrically conductive lines 90. Alternatively, the lower set of access lines can be second electrically conductive lines 90 and the upper set of access lines can be first electrically conductive lines 30.

In one embodiment, the lower-level dielectric layer 110 and the upper-level dielectric layer 199 include a respective dielectric material such as undoped silicate glass, a doped silicate glass, organosilicate glass, or silicon nitride. The thickness of each of the lower-level dielectric layer 110 and the upper-level dielectric layer 199 may be in a range from 50 nm to 600 nm, such as from 100 nm to 300 nm, although lesser and greater thicknesses can also be employed. Each of the first electrically conductive lines 30 and the second electrically conductive lines 90 may include a high electrical conductivity metal such as tantalum, tungsten, titanium, copper, molybdenum, ruthenium, a stack thereof, or an alloy thereof. In one embodiment, each of the first electrically conductive lines 30 and the second electrically conductive lines 90 may include a combination of a conductive metallic barrier liner including TiN, TaN, and/or WN and a conductive fill material located inside the metallic barrier liner. The conductive fill material may include copper, tungsten, molybdenum, tantalum, titanium, ruthenium, etc. The thickness of the first electrically conductive lines 30 and the second electrically conductive lines 90 can be in a range from 50 nm to 600 nm, such as from 100 nm to 300 nm, although lesser and greater thicknesses can also be employed.

The material layer stack is deposited over the top surface of the lower-level dielectric layer 110 to provide a two-dimensional array of magnetoresistive memory devices 180. The material layer stack can include, from bottom to top, a first electrode layer (that is subsequently patterned to form a first electrode 112), a magnetic tunnel junction 150 layer stack, and a second electrode layer (that is subsequently patterned to form a second electrode 170). The magnetic tunnel junction 150 layer stack can include, from bottom to top or from top to bottom, an optional synthetic antiferromagnetic (SAF) structure 120 layer stack, an optional first amorphous nonmagnetic metal layer (e.g., first texture breaking layer) 122, a first tunneling dielectric layer 131, a ferromagnetic reference layer 134 which is a metallic quantum well layer having discrete energy states, a second tunneling dielectric layer 133, a ferromagnetic free layer 144 with is a metallic quantum well layer having discrete energy states, a third tunneling dielectric layer 135, and an optional second amorphous nonmagnetic metal layer (e.g., second texture breaking layer) 166. A metallic cap layer 172 may be optionally formed between the second electrode 170 and the second electrically conductive line 90.

The first electrode layer includes a nonmagnetic transition metal, and may include one or more of Ta, Ti, V, Cr, Mn, Zr, Nb, Mo, Tc, Ru, Rh, Hf, W, Re, Os, and Ir. In one embodiment, the first electrode layer can include tantalum. The first electrode layer can be deposited, for example, by sputtering. The first electrode layer can have a thickness in a range from 5 nm to 20 nm. The first electrode layer may be deposited as a polycrystalline layer. Optionally, an anneal process may be performed to induce crystallization of the first electrode layer. In one embodiment, the first electrode layer may include, and or may consist essentially of, tantalum.

The SAF structure 120 layer stack (if present) includes antiferromagnetically coupled layers, which may containing at least one ferromagnetic material layer, at least one nonmagnetic spacer layer and at least one second ferromagnetic layer. Alternatively, a hard magnetization layer may be used instead of the SAF structure 120 or inside the SAF structure 120 to fix the magnetization direction of the reference layer 134.

The optional first amorphous nonmagnetic metal layer 122, if present, can include a first nonmagnetic transition metal, which may be tungsten, tantalum, niobium, molybdenum, rhenium, platinum, ruthenium, palladium, iridium, or an alloy thereof. The optional first amorphous nonmagnetic metal layer 122 includes a nonmagnetic transition metal having a melting point of at least 1,500 degrees Celsius so that bulk diffusion within the optional first amorphous nonmagnetic metal layer 122 is insufficient to cause further crystallization therein or to function as a template for solid phase epitaxy in a subsequent anneal process. The optional first amorphous nonmagnetic metal layer 122 may be deposited as an amorphous material by physical vapor deposition performed at room temperature. The thickness of the optional first amorphous nonmagnetic metal layer 122 can have a thickness in a range from 0.2 nm to 1 nm. The first amorphous nonmagnetic metal layer 122 may function as a texture breaking layer which breaks the <111> direction texture of the underlying polycrystalline first electrode layer.

The first tunneling dielectric layer 131 can be formed by depositing a dielectric metal oxide material, which may include, and/or may consist essentially of, MgO, $MgAl_2O_4$, $ZnAl_2O_4$, $SiMg_2O_4$, $SiZn_2O_4$, $MgGa_2O_4$, Mg—Al—Ox (which could be a disordered spinel structure), doped derivatives therefrom in which a fraction of at least one metallic element or silicon is replaced with another metallic element or silicon while preserving the crystalline structure, and oxygen-deficient derivatives thereof.

In case the first tunneling dielectric layer 131 includes magnesium oxide, the first tunneling dielectric layer 131 may have predominantly (001) texture. As used herein, a crystallographic plane texture in a material layer refers to a growth condition or a crystalline structure in which grains having crystallographic orientations that are perpendicular to the crystallographic plane are predominant, i.e., occupy more than 50% of the entire volume of the material layer. For example, (001) texture in a material layer refers to a growth condition or a crystalline structure in which grains having growth directions or having axial directions that are perpendicular to the (001) plane occupy more than 50% of the entire volume of the material layer. In other words, (001) texture in a material layer refers to a growth condition or a crystalline structure in which grains having a <001> direction as a growth direction or as an axial direction occupy more than 50% of the entire volume of the material layer. As used herein, an axial direction refers to the direction that is perpendicular to the planes of the interfaces between neighboring layers. The volume fraction of grains having (001) planes along the growth plane (i.e., having a <001> direction as the axial direction) within the magnesium oxide material of the first tunneling dielectric layer 131 can be in a range from 0.5 to 1, such as from 0.8 to 0.99.

In another embodiment, the first tunneling dielectric layer 131 includes an amorphous spinel material. As used herein, a "spinel" refers to a dielectric compound having a formula of $M_1Q_2O_4$, in which M and Q are metals or silicon, and the dielectric compound has a crystalline structure with a space group of $F\bar{4}3m$. Exemplary spinels include $MgAl_2O_4$, $ZnAl_2O_4$, $SiMg_2O_4$, $SiZn_2O_4$, $MgGa_2O_4$, doped derivatives therefrom in which a fraction of at least one metallic element is replaced with another metallic element while preserving the crystalline structure, and oxygen-deficient derivatives or disordered spinel derivatives (e.g., Mg—Al—Ox) thereof. In one embodiment, the amorphous spinel material of the first tunneling dielectric layer 131 can be deposited directly on the first amorphous nonmagnetic metal layer 122. The first tunneling dielectric layer 131 can be formed by physical vapor deposition (e.g., sputtering) or vacuum evaporation of source materials including component atoms of the spinel material. The thickness of the first tunneling dielectric layer 131 can be in a range from 0.5 nm to 2 nm, such as 0.8 nm to 1 nm, although lesser and greater thicknesses can also be employed.

The reference layer 134 can be formed by depositing a first amorphous ferromagnetic material. For example, the reference layer 134 can include an amorphous Fe layer, CoFe layer, a CoFeB layer, an amorphous stack of Co/Ni multilayers or Co/Pt multilayers. The reference layer 134 may be deposited as an amorphous material by physical vapor deposition performed at room temperature. In one embodiment, the reference layer 134 can comprise, and/or can consist essentially of, a ferromagnetic material in which a total atomic percentage of Fe, Co, Ni, and B is at least 80%. In another embodiment, the reference layer 134 comprises, and/or consists essentially of, a Heusler alloy. The thickness of the reference layer 134 can be in a range from 0.5 nm to 2 nm, such as 0.8 nm to 1.2 nm, although lesser and greater thicknesses can also be employed.

The second tunneling dielectric layer 133 may include any of the dielectric metal oxide materials that may be employed for the first tunneling dielectric layer 131. In a preferred embodiment, the first tunneling dielectric layer 131 comprises MgO having the (001) texture, and the second tunneling dielectric layer 133 which is located between the reference layer 134 and the free layer 144 comprises an amorphous stoichiometric or disordered spinel material, such as $MgAl_2O_4$ or Mg—Al—Ox. The thickness of the second tunneling dielectric layer 133 can be in a range from 0.8 nm to 2 nm, such as 0.8 nm to 1.2 nm, although lesser and greater thicknesses can also be employed. In one embodiment, the second tunneling dielectric 133 may be thicker than the first and third tunneling dielectric layers (131, 135) by one or more atomic monolayers.

Optionally, as shown in FIG. 4B, an additional reference layer 154 may be formed, which can have the same energy level, the same material composition, and the same thickness range as the reference layer 134. Optionally, an additional tunneling dielectric layer 137 may be formed, which can have any of the dielectric metal oxide material that may be employed for the first tunneling dielectric layer 131 and/or the second tunneling dielectric layer 133, and may have the same thickness range as the first tunneling dielectric layer 131 and/or the second tunneling dielectric layer 133.

Referring to both FIGS. 4A and 4B, the free layer 144 can be formed by depositing a second amorphous ferromagnetic material. For example, the free layer 144 can include an amorphous Fe layer, a CoFe layer, a CoFeB layer, an amorphous stack of Co/Ni multilayers or Co/Pt multilayers. The free layer 144 may be deposited as an amorphous material by physical vapor deposition performed at room temperature. In one embodiment, the free layer 144 can comprise, and/or can consist essentially of, a ferromagnetic material in which a total atomic percentage of Fe, Co, Ni, and B is at least 80%. In another embodiment, the free layer 144 comprises, and/or consists essentially of, a Heusler alloy. The thickness of the free layer 144 can be in a range from 0.5 nm to 2 nm, such as 0.8 nm to 1.2 nm, although lesser and greater thicknesses can also be employed.

In one embodiment, each of the reference layer 134 and the free layer 144 comprises, and/or consists essentially of, a respective ferromagnetic material in which a total atomic percentage of Fe is at least 80%, and may consist essentially of iron with unavoidable impurities. In another embodiment, each of the reference layer 134 and the free layer 144 comprises a respective Heusler alloy. The Heusler alloy layer may include any suitable ferromagnetic alloy having a formula $M_2TX$, where M is a first transition metal, T is a second transition metal different from the first transition metal and X is an element from Groups 13 to 17 of the Periodic Table of elements. For example, M may be Co, Ni, Fe, Pd and/or Mn, T may be Fe, Mn and/or V and X may be Si, Al, Ge, Sb, Ga and/or Sn. For example, the ferromagnetic alloy may consist essentially a cobalt-iron-aluminum (e.g., $Co_2FeAl$) alloy or a cobalt-manganese-germanium ($Co_2MnGe$) alloy.

The third tunneling dielectric layer 135 may include any of the dielectric metal oxide materials that may be employed for the first tunneling dielectric layer 131, and may have the same thickness range as the first tunneling dielectric layer 131. For example, the third tunneling dielectric layer 135 may comprise MgO with (001) texture and having a thickness in a range from 0.5 nm to 2 nm, such as 0.8 nm to 1 nm, although lesser and greater thicknesses can also be employed.

At least one of the first tunneling dielectric layer 131, the second tunneling dielectric layer 133, and the third tunneling dielectric layer 135 can be formed with (001) texture. In other words, a predominant portion of at least one of the first tunneling dielectric layer 131, the second tunneling dielectric layer 133, and the third tunneling dielectric layer 135 can be formed with (001) texture is formed with a <001> growth direction with a (001) growth plane. In one embodiment, at least one of the first tunneling dielectric layer 131, the second tunneling dielectric layer 133, and the third tunneling dielectric layer 135 can be formed with (001) texture comprises a magnesium oxide layer. The propensity to provide (001) texture in the deposited magnesium oxide capping dielectric layer is an inherent crystalline property of magnesium oxide. The deposition temperature for the third tunneling dielectric layer 135 can be room temperature. In one embodiment, each of the tunneling dielectric layers (131, 133, 135) may include magnesium oxide. In one embodiment, at least one of the first tunneling dielectric layer 131, the second tunneling dielectric layer 133, and the third tunneling dielectric layer 135 can include a magnesium oxide layer, and at least another of the first tunneling dielectric layer 131, the second tunneling dielectric layer 133, and the third tunneling dielectric layer 135 can include a spinel layer.

The optional second amorphous nonmagnetic metal layer 166 can include a second nonmagnetic transition metal, which may be tungsten, tantalum, niobium, molybdenum, rhenium, platinum, palladium, iridium, or an alloy thereof. The optional second amorphous nonmagnetic metal layer 166 includes a nonmagnetic transition metal having a melting point of at least 1,500 degrees Celsius so that bulk diffusion within the optional second amorphous nonmagnetic metal layer 166 is insufficient to cause further crystallization therein or to function as a template for solid phase epitaxy in a subsequent anneal process. The first nonmagnetic transition metal of the optional first amorphous nonmagnetic metal layer 122 and the second nonmagnetic transition metal of the optional second amorphous nonmagnetic metal layer 166 may be selected independently. In one embodiment, the first nonmagnetic transition metal and the second nonmagnetic transition metal may be tungsten. The optional second amorphous nonmagnetic metal layer 166 may be deposited as an amorphous material by physical vapor deposition performed at room temperature. The thickness of the optional second amorphous nonmagnetic metal layer 166 can have a thickness in a range from 0.2 nm to 1 nm. The second amorphous nonmagnetic metal layer 166 can also function as a texture breaking layer.

The second electrode layer includes a nonmagnetic transition metal, and may include one or more of Ta, Ti, V, Cr, Mn, Zr, Nb, Mo, Tc, Ru, Rh, Hf, W, Re, Os, and Ir. The second electrode layer may be deposited by sputtering. The thickness of the second electrode layer can be in a range from 2 nm to 10 nm, such as from 3 nm to 8 nm, although lesser and greater thicknesses can also be employed.

The optional metallic cap layer 172 includes a nonmagnetic transition metal, and may include one or more of Ta, Ti, V, Cr, Mn, Zr, Nb, Mo, Tc, Ru, Rh, Hf, W, Re, Os, and Ir. The metallic cap layer 172 may be deposited by sputtering. The thickness of the metallic cap layer 172 can be in a range from 2 nm to 10 nm, such as from 3 nm to 8 nm, although lesser and greater thicknesses can also be employed. In one embodiment, the second electrode layer can include tantalum, and the metallic cap layer 172 can include ruthenium.

A post-deposition anneal process can be performed at an elevated temperature in a range from 250 degrees Celsius to 500 degrees Celsius optionally in the presence of a vertical magnetic field. Generally, the elevated temperature of the anneal process is selected such that solid phase epitaxy of amorphous materials of the free layer 144, the reference layer 134, and any amorphous material within the tunneling dielectric layers (131, 133, 135). As discussed above, at least one of the tunneling dielectric layers (131, 133, 135) includes a polycrystalline material with (001) texture. The polycrystalline layer with the (001) texture functions as a template layer for the solid phase epitaxy process to enhance epitaxial alignment among grains across the various layers between the amorphous nonmagnetic metal layers (122, 166).

In an illustrative example, if the first tunneling dielectric layer 131 and/or the third tunneling dielectric layer 135 comprise MgO layers which have (001) texture, and if the second tunneling dielectric layer 133 is an amorphous spinel layer, the first amorphous nonmagnetic metal layer 122 can be employed to block propagation of any crystalline structure from the first electrode 112 and the second amorphous nonmagnetic metal layer 166 can be employed to block propagation of any crystalline structure from the second electrode 170.

During the thermal anneal process, the grains in the amorphous tunneling dielectric layer(s) grow and merge with (001) texture. In one embodiment, the entirety of any amorphous material of the tunneling dielectric layers (131, 133, 135), the amorphous material of the reference layer 134, and the amorphous material of the free layer 144 crystallizes with (001) large textured grains that occupies a predominant volume (such a more than 80%, and/or more than 90%, and/or more than 95%, and/or more than 98%, and/or more than 99%) of each layer. In one embodiment, the thermal anneal process comprises the solid phase epitaxy process.

For example, (001) textured crystal structure propagates from one or both of MgO first tunneling dielectric layers (131, 135) through the stack of the reference layer 134, amorphous spinel second tunneling dielectric layer 133 and free layer 144 to crystallize them with preferred (001) orientation. The lattice matching between the amorphous spinel second tunneling dielectric layer 133 and the reference and free layers (134, 144) may be improved if the amorphous spinel second tunneling dielectric layer 133 comprises $MgAl_2O_4$ and the reference and free layers (134, 144) consist essentially of iron or consists essentially of a ferromagnetic Heusler alloy, such as $Co_2FeAl$ or $Co_2MnAl$. This improves the quality of the interface between the amorphous spinel second tunneling dielectric layer 133 and the reference and free layers (134, 144) which improves the resonant tunneling effect. Furthermore, a large perpendicular magnetic anisotropy (PMA) energy may be obtained due to a reduction of the bulk anisotropy contribution. In this embodiment, the reference layer 134 and/or the free layer 144 may have the same thickness or a greater thickness or a smaller thickness than each of the tunneling dielectric layers (131, 133, 135) while retaining the high TMR due to the improved interface between the above layers.

Grains in each layer between the optional first amorphous nonmagnetic metal layer 122 and the optional second amorphous nonmagnetic metal layer 166 (and/or between the hard magnetization layer 120 and the second electrode 170) are oriented along the (001) direction after the solid phase epitaxy process. Each of the tunneling dielectric layers (131,133, 135), the reference layer 134, and the free layer 144 has highly (001)-textured grains that are epitaxially aligned across multiple layers. The average grain size (i.e., the diameter of a sphere having the same volume as the average volume of the grains) can be on the order of the thickness of each layer or larger. For example, the average grain size of grains in each tunneling dielectric layer (131, 133, 135) may be in a range from 1 nm to 4 nm, although lesser and greater grain sizes can also be employed.

Subsequently, the upper-level dielectric layer 199 embedding the upper set of access lines can be formed. In one embodiment, the lower set of access lines can be first electrically conductive lines 30 and the upper set of access lines can be second electrically conductive lines 90. Each second electrode 170 can be electrically contacted by one of the upper set of access lines (such as a second electrically conductive line 90).

According to the first embodiment of the present disclosure illustrated in FIGS. 4A and 4B, a magnetoresistive memory device comprises a first electrode 112, a second electrode 170, and a magnetic tunnel junction 150 located between the first electrode and the second electrode. The magnetic tunnel junction 150 comprises a ferromagnetic reference layer 134, a ferromagnetic free layer 144, a first tunneling dielectric layer 131 located between one of the reference layer or the free layer, and one of the first electrode of the second electrode, and a second tunneling dielectric layer 133 located between the reference layer and the free layer.

In one optional embodiment each of the first and the second tunneling dielectric layers (131, 133) is at least 50% thicker than each of the reference layer 134 and the free layer 144. In one optional embodiment each of the first and the second tunneling dielectric layers is at least two times thicker than each of the reference layer and the free layer.

In one embodiment, the free layer 144 has two stable magnetization states which comprise a parallel state having a parallel magnetization direction that is parallel to a fixed magnetization direction of the reference layer 134, and an antiparallel state having an antiparallel magnetization direction that is antiparallel to the fixed magnetization direction of the reference layer, an energy level of one of a parallel state and an antiparallel state of the free layer matches an energy level of the reference layer within 0.1 eV, and an energy level of another of the parallel state and the antiparallel state of the free layer is offset from the energy level of the reference layer at least by 0.1 eV.

Quantum well states (QWS's) in ferromagnetic layers are spin-dependent. In other words, an electron with spin-up and spin-down (spin up/down means the direction of conduction electron spins are along/opposite to the direction of the magnetization, respectively) have different energy levels. If a thickness of a ferromagnetic material of the reference and free layers is selected such that a QWS for spin-up electrons is at (e.g., equals to or differs by a small energy, such as by less than 0.1 eV) the Fermi level of at least one of the first and the second electrodes, while for spin-down electrons QWS is away (i.e., differs by at least 0.1 eV from the Fermi level. In the parallel state where the free layer magnetization is parallel to the reference layer magnetization, electrons with spin-up would tunnel through QWSs in both ferromagnetic layers leading to resonant tunneling. In contrast, electrons with spin-down would tunnel in off-resonant state and therefore their contribution to transport can be neglected. In the antiparallel state, electrons with spin-up in one ferromagnetic layer become spin-down electrons for another ferromagnetic layer and vice versa. In this case resonant tunneling through entire structure does not occur. The above may be summarized in a short hand notation as an energy level (i.e., QWS) of the parallel state of the free layer matches an energy level of the reference layer and a Fermi energy level of at least one of the first and the second electrodes within 0.1 eV, and an energy level of the antiparallel state of the free layer is offset from the energy level of the reference layer and the Fermi energy level of at least one of the first and the second electrodes at least by 0.1 eV.

In one embodiment each of the reference layer 134 and the free layer 144 comprises a respective ferromagnetic material in which a total atomic percentage of Fe, Co, Ni, and B is at least 80%. For example, in a one embodiment, each of the reference layer and the free layer consist essentially of iron, the first tunneling dielectric layer comprises MgO and the second tunneling dielectric comprises $MgAl_2O_4$. In another embodiment, embodiment each of the reference layer and the free layer comprise a Heusler alloy, the first tunneling dielectric layer comprises MgO and the second tunneling dielectric comprises $MgAl_2O_4$. The device 180 may comprise a STT MRAM memory cell.

In one embodiment shown in FIG. 4B, the device 180 further comprises a third tunneling dielectric layer 135 located between another one of the reference layer or the free layer, and another one of the first electrode of the second electrode. The device 180 may also comprise a first nonmagnetic texture break metal layer 122 located between the first electrode 112 and the magnetic tunnel junction 150, and a second texture break nonmagnetic metal layer 166 located between the magnetic tunnel junction 150 and the second electrode 170.

In another aspect of the first embodiment, a magnetoresistive memory device 180 comprises a first electrode 112, a second electrode 170, and a magnetic tunnel junction 150 located between the first electrode and the second electrode. The magnetic tunnel junction 150 comprises an iron or Heusler alloy ferromagnetic reference layer 134, an iron or Heusler alloy ferromagnetic free layer 144, a (001) textured magnesium oxide first tunneling dielectric layer 131 located between one of the reference layer or the free layer, and one of the first electrode of the second electrode, and a (001) textured $MgAl_2O_4$ second tunneling dielectric layer 133 located between the reference layer 134 and the free layer 144. The grains of the free layer 144 may have (001) texture and be epitaxially aligned to grains the second tunneling dielectric layer 133.

According to another aspect of the first embodiment of the present disclosure, a method of forming the magnetoresistive memory device 180 comprises forming a first electrode 112 over a substrate, depositing a magnetic tunnel junction 150 layer stack over the first electrode, wherein the magnetic tunnel junction layer stack comprises, from one side to another, a first texture-breaking nonmagnetic layer 122 including a first nonmagnetic transition metal, a magnesium oxide first tunneling dielectric layer 131 including grains having (001) texture, a reference layer 134 including a first amorphous ferromagnetic material, a spinel second dielectric tunneling layer 133 including an amorphous spinel material, a free layer 144 including a second amorphous ferromagnetic material, a magnesium oxide third tunneling dielectric layer 135 including grains having (001) texture, and a second texture-breaking nonmagnetic layer 166 including a second nonmagnetic transition metal, performing an anneal process to induce solid phase epitaxy crystallization of materials of the free layer, the second tunneling dielectric layer, and the reference layer using at least one of the first or the third tunneling dielectric layer as a crystallization template layer, to convert the amorphous spinel material of the second tunneling dielectric layer into polycrystalline spinel material having (001) texture along an axial direction that is perpendicular to an interface between the second tunneling dielectric layer and the free layer, and forming a second electrode over a portion of the magnetic tunnel junction layer stack prior to or after the anneal process.

In one embodiment the solid phase epitaxy converts each of the reference layer 134 and the free layer 144 into polycrystalline iron or Heusler alloy ferromagnetic material layers having (001) texture. In one embodiment, the spinel material comprises $MgAl_2O_4$. In one embodiment, each of the first texture-breaking nonmagnetic layer and the second texture-breaking nonmagnetic layer blocks propagation of crystalline alignment of materials thereacross during the solid phase epitaxy crystallization.

In an alternative aspect of the first embodiment, the magnetoresistive memory device may be switched by a voltage-controlled magnetic anisotropy ("VCMA") method rather than the STT method. In the VCMA configuration, the tunneling dielectric layer located between the reference layer 134 and the free layer 134 may be made thicker than that in the STT configuration. In both the STT and VCMA configurations of the magnetoresistive memory device of the first embodiment, the increased TMR improves the reading of the memory state of the device.

Figure 5A:
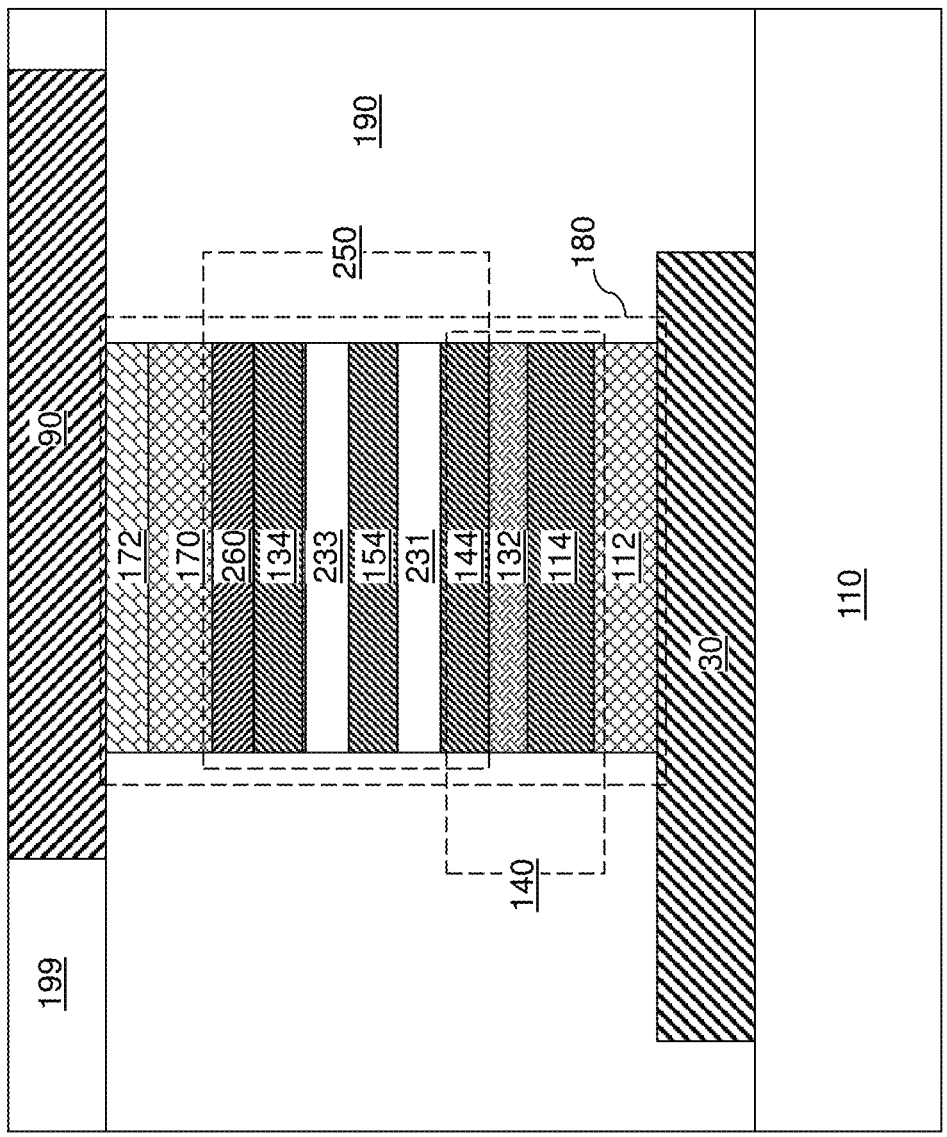
FIG. 5A is a vertical cross-sectional view of a first configuration of an exemplary voltage controlled exchange coupling magnetoresistive memory device according to second embodiment of the present disclosure.
Figure 5B:
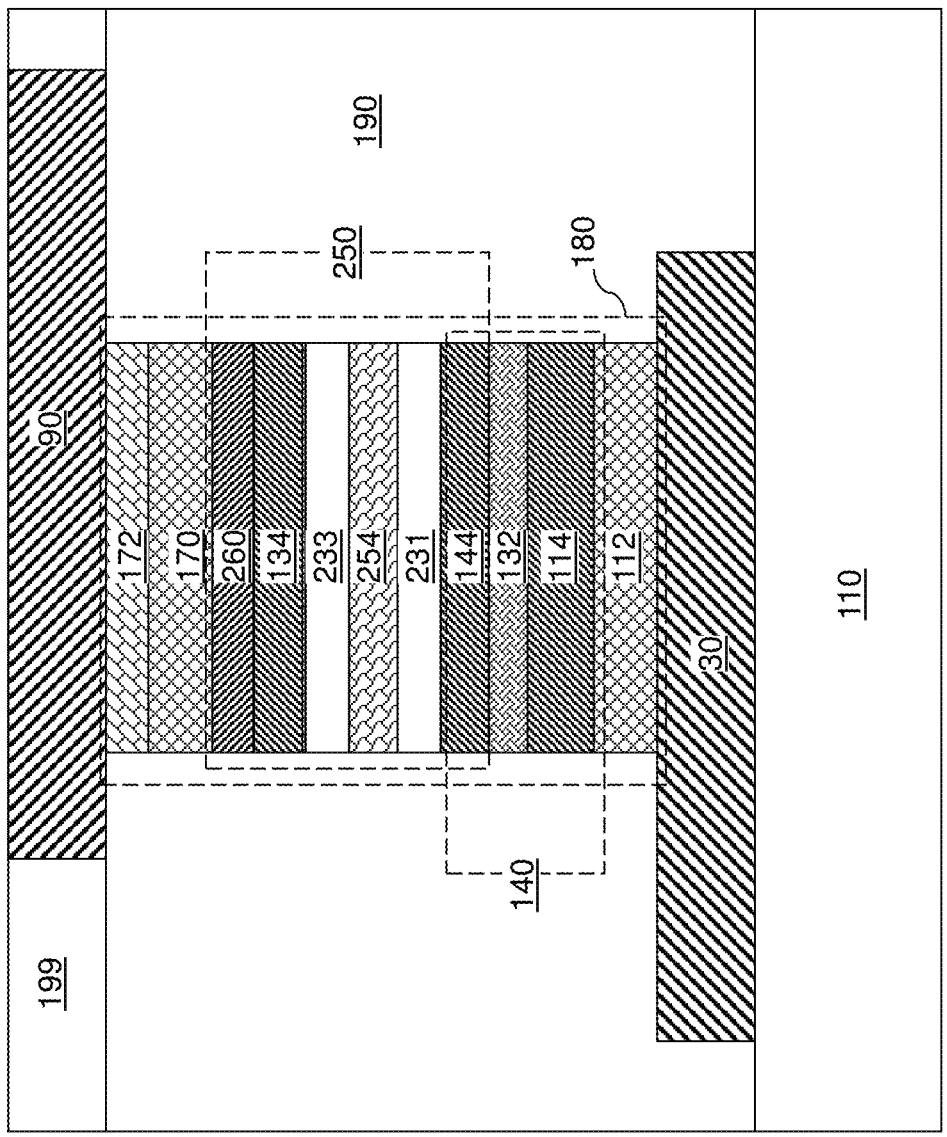
FIG. 5B is a vertical cross-sectional view of a second configuration of an exemplary voltage controlled exchange coupling magnetoresistive memory device according to the second embodiment of the present disclosure.

Referring to FIGS. 5A-5B, an exemplary voltage controlled exchange coupling (VCEC) magnetoresistive memory device according to a second embodiment of the present disclosure is illustrated. The VCEC magnetoresistive memory device may be written (i.e., programmed) by a combination of STT and VCEC effects and may be read using the TMR effect, as described in U.S. patent application Ser. No. 16/824,814, filed on Mar. 20, 1920, and incorporated herein by reference in its entirety. The illustrated magnetoresistive memory device 180 of FIGS. 5A-5B may be a magnetoresistive memory device 180 within the array of magnetoresistive memory devices 180 illustrated in FIG. 1. Each of the magnetoresistive memory devices 180 of FIGS. 5A-5B can be derived from the exemplary structure of FIGS. 4A and 4B by modifying the layer stack between the first electrically conductive line 30 and the second electrically conductive line 90.

Each of the magnetoresistive memory devices 180 of FIGS. 5A-5B includes a layer stack that includes at least, from one side to another, a first electrode 112, a perpendicular-magnetic-anisotropy (PMA) ferromagnetic layer 114, an electrically conductive, nonmagnetic interlayer exchange coupling layer 132, a ferromagnetic free layer 144, a first tunneling dielectric layer 231, a metallic quantum well layer (154, 254) which may be ferromagnetic metallic quantum well layer 154 (which may function as an additional reference layer) or a nonmagnetic metallic quantum well layer 254, a second tunneling dielectric layer 233, a ferromagnetic reference layer 134, an optional SAF structure 260 and/or hard magnetization layer, and a second electrode 170. In one embodiment, the first electrode 112 can be electrically connected to one of the first electrically conductive (e.g., word) lines 30, and the second electrode 170 can be electrically connected to one of the second electrically conductive (e.g., bit) lines 90. A metallic cap layer 172 may be optionally formed between the second electrode 170 and a second electrically conductive line 90. Alternatively, the first electrode 112 can be connected to one of the second electrically conductive lines 90, and the second electrode 170 can be connected to one of the first electrically conductive lines 30. The material stack including the PMA ferromagnetic layer 114, the nonmagnetic interlayer exchange coupling layer 132, and the free layer 144 constitutes a voltage controlled exchange coupling (VCEC) layer stack 140. The material stack including the free layer 144, the first tunneling dielectric layer 231, the metallic quantum well layer (154, 254), the second tunneling dielectric layer 233, the reference layer 134, and the SAF structure 260 comprises a magnetic tunnel junction 250.

The first electrode 112 can have the same material composition and the same dimensions as the first electrode 112 of the magnetoresistive memory devices 180 of FIGS. 4A and 4B. The perpendicular-magnetic-anisotropy (PMA) ferromagnetic layer 114 includes a material that can provide high perpendicular magnetic anisotropy. Thus, the magnetization direction of the PMA ferromagnetic layer 114 is along a vertical direction, i.e., the direction that is perpendicular to the interfaces between contacting layers within the hybrid magnetoresistive memory cell. The ferromagnetic material of the PMA ferromagnetic layer 114 does not need to generate any spin-polarized current. Thus, any hard magnetic material that can provide high perpendicular magnetic anisotropy can be employed for the PMA ferromagnetic layer 114.

In one embodiment, the PMA ferromagnetic layer 114 comprises a material selected from a FePt alloy, a FePd alloy, a CoPt alloy, a Pt/Co multilayer stack, a Co/Ag multilayer stack, a Co/Cu multilayer stack, a Co/Ni multilayer stack, a (Pt/Co/Pt)/Pd multilayer stack, a (Pt/Co/Pt)/Ag multilayer stack, a (Pt/Co/Pt)/Cu multilayer stack, a (Pt/Co/Pt)/Ni multilayer stack, and a Co/(Pt/Pd) multilayer stack. In an illustrative example, the PMA ferromagnetic layer 114 can include $L1_0$ alloys of FePt, FePd, or CoPt disclosed in Journal of Applied Physics 111, 07A708 (2012). The FePt alloy, the FePd alloy, and the CoPt alloy can have a magnetic anisotropy constant of $6.6 \times 10^7$ erg/cm$^3$, $1.8 \times 10^7$ erg/cm$^3$, and $4.9 \times 10^7$ erg/cm$^3$, respectively. In another illustrative example, the PMA ferromagnetic layer 114 can include Pt/Co multiplayers, Co/Ag multilayers, Co/Cu multilayers, or Co/Ni multilayers, or can include (Pt/Co/Pt)/Pd multilayers, (Pt/Co/Pt)/Ag multilayers, (Pt/Co/Pt)/Cu multilayers, or (Pt/Co/Pt)/Ni multilayers disclosed in IEEE Transaction on Magnetics 31, 3337 (1995). In yet another illustrative example, the PMA ferromagnetic layer 114 can include Co/(Pt/Pd) multilayers or Co/(Pd/Pt) multilayers disclosed in Journal of Applied Physics 77, 3995 (1995). The PMA ferromagnetic layer 114 can have a fixed magnetization direction, which can be a vertical direction, i.e., an upward direction or a downward direction.

The nonmagnetic interlayer exchange coupling layer 132, includes an electrically conductive, non-magnetic material that can provide a voltage-dependent exchange coupling between the PMA ferromagnetic layer 114 and the free layer 144 such that energy levels of a parallel state and an antiparallel state of the free layer 144 shift in opposite directions upon application of a voltage between the electrode layers (112, 170) (e.g., upon application of a voltage between the first electrode 112 and the second electrode 170).

Suitable materials for the nonmagnetic interlayer exchange coupling layer 132 include non-magnetic electrically conductive materials, such as metallic materials (e.g., elemental metals and metal alloys), for example, including but not restricted to, Au, Cu, Cr, and/or Al and their alloys. In one embodiment, the nonmagnetic interlayer exchange coupling layer 132 can consist essentially of a metallic element selected from Au, Cu, Cr, and Al. In one embodiment, the nonmagnetic interlayer exchange coupling layer 132 can have a thickness in a range from one atomic layer (i.e., monolayer) of the metallic element to five layers of the metallic element, such as from two to four atomic layers. For example, the nonmagnetic interlayer exchange coupling layer 132 can have a thickness of 0.1 to 7 nm, such as 0.3 to 5 nm.

The free layer 144 can have the same material composition and the same dimensions as the free layer 144 of the magnetoresistive memory devices 180 of FIGS. 4A and 4B. The free layer 144 has a thickness that is thin enough to quantize the energy levels within the free layer 144. For example, the free layer 144 can have a thickness in a range from 0.3 nm to 2 nm, such as 0.5 nm to 1.2 nm, although greater thicknesses may also be employed. Thus, the free layer 144 has discrete energy states. The free layer 144 can have a parallel state in which the magnetization direction of the free layer 144 is parallel to the fixed magnetization direction of the PMA ferromagnetic layer 114, and an antiparallel state in which the magnetization direction of the free layer 144 is antiparallel to the fixed magnetization direction of the PMA ferromagnetic layer 114.

The first tunneling dielectric layer 231 may have the same thickness range and the same material composition as the first tunneling dielectric layer 131 of the magnetoresistive memory devices 180 of FIGS. 4A and 4B.

The metallic quantum well layer (154, 254) may be a ferromagnetic quantum well (e.g., additional reference) layer 154 or may be a nonmagnetic metallic quantum well layer 254. In the embodiment shown in FIG. 5A, the metallic quantum well layer (154, 254) is a quantum well ferromagnetic reference layer 154, which may have the same thickness range and the same material composition as the reference layer 134 of the magnetoresistive memory devices 180 of FIGS. 4A and 4B. In another embodiment shown in FIG.

5B, the metallic quantum well layer (154, 254) is a nonmagnetic metallic quantum well layer 254 having a thickness that is thin enough to quantize the energy levels therein. For example, the thickness of the nonmagnetic metallic quantum well layer 254 may be in a range from 0.3 nm to 2 nm, such as 0.5 nm to 1.2 nm, although a greater thickness may be employed. The nonmagnetic metallic quantum well layer 234 includes a metal, which can be, for example, Ta, Ti, V, Cr, Mn, Zr, Nb, Mo, Tc, Ru, Rh, Hf, W, Re, Os, Jr, and/or alloys thereof.

In one embodiment, the energy level of one of the parallel state and the antiparallel state of the free layer 144 can be within 0.1 eV from a discrete energy level of the metallic quantum well layer (154, 254), and an energy level of another of the parallel state and the antiparallel state of the free layer 144 is offset from each discrete energy level of the metallic quantum well layer (154, 254) by at least by 0.1 eV.

The second tunneling dielectric layer 233 may have the same thickness range and the same material composition as the second tunneling dielectric layer 133 of the magnetoresistive memory devices 180 of FIGS. 4A and 4B. The metallic quantum well layer (154, 254) is located between the first and second tunneling dielectric layers (231, 233) which function as energy barriers for the metallic quantum well layer (154, 254).

The reference layer 134 may have the same thickness range and the same material composition as the reference layer 134 of the magnetoresistive memory devices 180 of FIGS. 4A and 4B.

The SAF structure 260 may be the same as the SAF structure 120 in the magnetoresistive memory device 180 of FIGS. 4A and 4B. The second electrode 170 and the metallic cap layer 172 may be the same as in the magnetoresistive memory device 180 of FIGS. 4A and 4B.

According to the second embodiment of the present disclosure illustrated in FIGS. 5A and 5B, a magnetoresistive memory device 180 comprises a voltage controlled exchange coupling layer stack 140 comprising a perpendicular magnetic anisotropy (PMA) ferromagnetic layer 114 having a fixed magnetization direction, a ferromagnetic free layer 144, and an electrically conductive nonmagnetic interlayer exchange coupling layer 132 located between the free layer and the PMA ferromagnetic layer and providing voltage dependent exchange coupling between the free layer and the PMA ferromagnetic layer, a magnetic tunnel junction 250 comprising a ferromagnetic reference layer 134, a first tunneling dielectric layer 231, a second tunneling dielectric layer 233, and a metallic quantum well layer (154, 254) located between the first and the second tunneling dielectric layers, where the magnetic tunnel junction 250 also includes the free layer 144, a first electrode 112 located on a first side of a combination of the voltage controlled exchange coupling layer stack and the magnetic tunnel junction, and a second electrode 170 located on a second side of the combination of the voltage controlled exchange coupling layer stack and the magnetic tunnel junction.

In one embodiment, the free layer 144 has two stable magnetization states which comprise a parallel state having a parallel magnetization direction that is parallel to the fixed magnetization direction, and an antiparallel state having an antiparallel magnetization direction that is antiparallel to the fixed magnetization direction. An energy level of one of the parallel state and the antiparallel state of the free layer is within 0.1 eV from a discrete energy level of the metallic quantum well layer, and an energy level of another of the parallel state and the antiparallel state of the free layer is offset from each discrete energy level of the metallic quantum well layer by at least by 0.1 eV.

In one embodiment, the metallic quantum well layer comprises a nonmagnetic metallic quantum well layer 254. In another embodiment, the metallic quantum well layer comprises a ferromagnetic quantum well layer 154.

In one embodiment, each of the first and the second tunneling dielectric layers comprises magnesium oxide or $MgAl_2O_4$. In one embodiment, the metallic quantum well layer (154, 254) has an average thickness in a range from 0.3 nm to 2 nm.

In one embodiment, energy levels of a parallel state and an antiparallel state of the free layer shift in opposite directions upon application of voltages of different polarities between the first electrode and second electrode due to voltage-controlled exchange coupling with the PMA ferromagnetic layer.

In one embodiment the PMA ferromagnetic layer 114 has greater perpendicular magnetic anisotropy than the free layer 144. In one embodiment, the nonmagnetic interlayer exchange coupling layer 132 has an exchange coupling coefficient having a magnitude in a range from $1 \times 10^{-7}$ erg/(V·cm) to $4 \times 10^{-6}$ erg/(V·cm) within a voltage range from ~10 V to 10 V. In one embodiment, the nonmagnetic interlayer exchange coupling layer consists essentially of at least one metallic element selected from Au, Cu, Cr or Al. In one embodiment, the PMA ferromagnetic layer comprises a material selected from a FePt alloy, a FePd alloy, a CoPt alloy, a Pt/Co multilayer stack, a Co/Ag multilayer stack, a Co/Cu multilayer stack, a Co/Ni multilayer stack, a (Pt/Co/Pt)/Pd multilayer stack, a (Pt/Co/Pt)/Ag multilayer stack, a (Pt/Co/Pt)/Cu multilayer stack, a (Pt/Co/Pt)/Ni multilayer stack, and a Co/(Pt/Pd) multilayer stack.

In one embodiment, the device further comprises a programming circuitry 570 configured to apply a programming voltage selected from a positive voltage pulse and a negative voltage pulse across the first electrode and the second electrode to induce the free layer to transition into a target magnetization state, and a sense circuitry 570 configured to apply a sense voltage pulse of a fixed polarity between the first electrode and the second electrode, wherein a magnitude of the sense voltage pulse is less than a voltage magnitude required to switch the magnetization state of the free layer.

As shown in FIG. 1, a magnetoresistive random access memory 501 comprises a two-dimensional array of instances of the magnetoresistive memory devices 180 (e.g., VCEC MRAM cells), word lines 30 electrically connecting a respective subset of the first electrodes of the two-dimensional array, bit lines 90 electrically connecting a respective subset of the second electrodes of the two-dimensional array; and a programming and sensing circuitry 570 connected to the bit lines 90.

A method of operating the magnetoresistive memory device 180 comprises applying a first polarity programming voltage to the first electrode relative to the second electrode in a first programming step to switch a magnetization of the free layer from a parallel state to an antiparallel state with respect to the fixed magnetization direction, applying a second polarity programming voltage having a polarity that is opposite to the first polarity voltage to the first electrode relative to the second electrode in a second programming step to switch the magnetization of the free layer from the antiparallel state to the parallel state with respect to the fixed magnetization direction, and applying a sense voltage pulse of a fixed polarity between the first electrode and the second electrode, wherein a magnitude of the sense voltage pulse is less than a voltage magnitude required to switch the magnetization of the free layer.

Figure 6B:
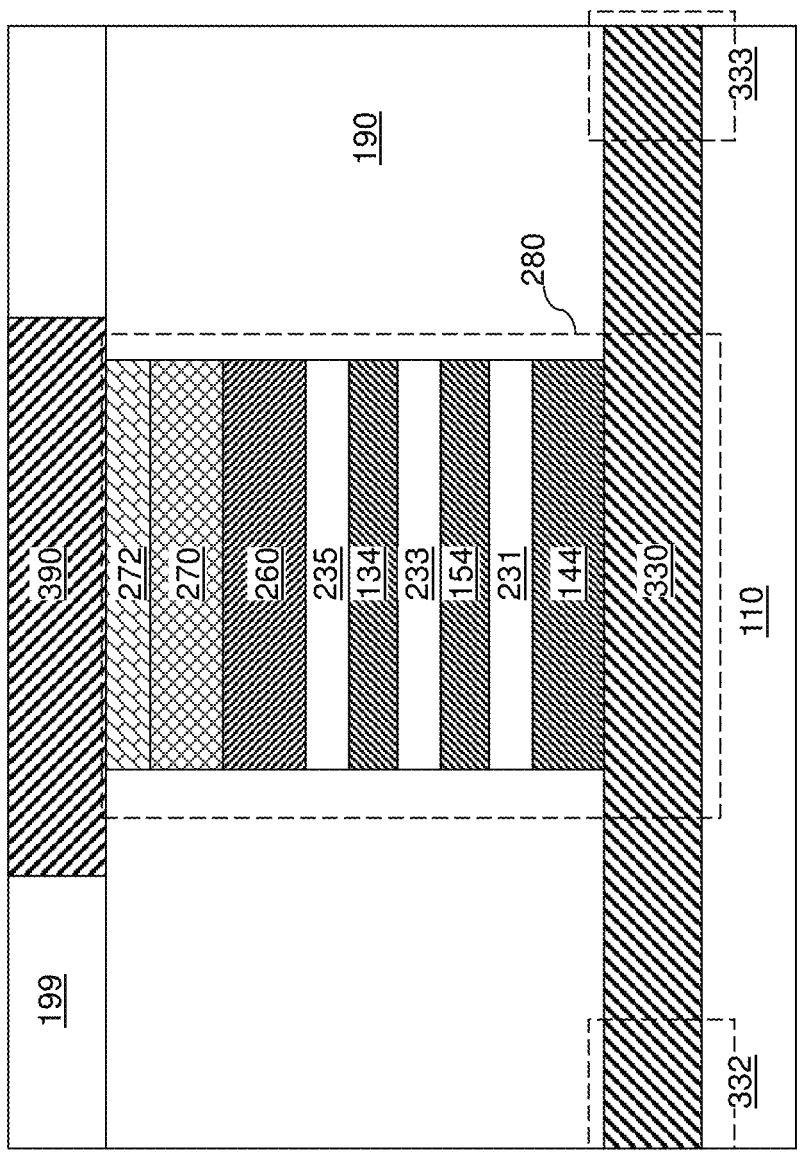
FIG. 6B is a vertical cross-sectional view of a second configuration of an exemplary spin-orbit-torque magnetoresistive memory device according to the third embodiment of the present disclosure.
Figure 6C:
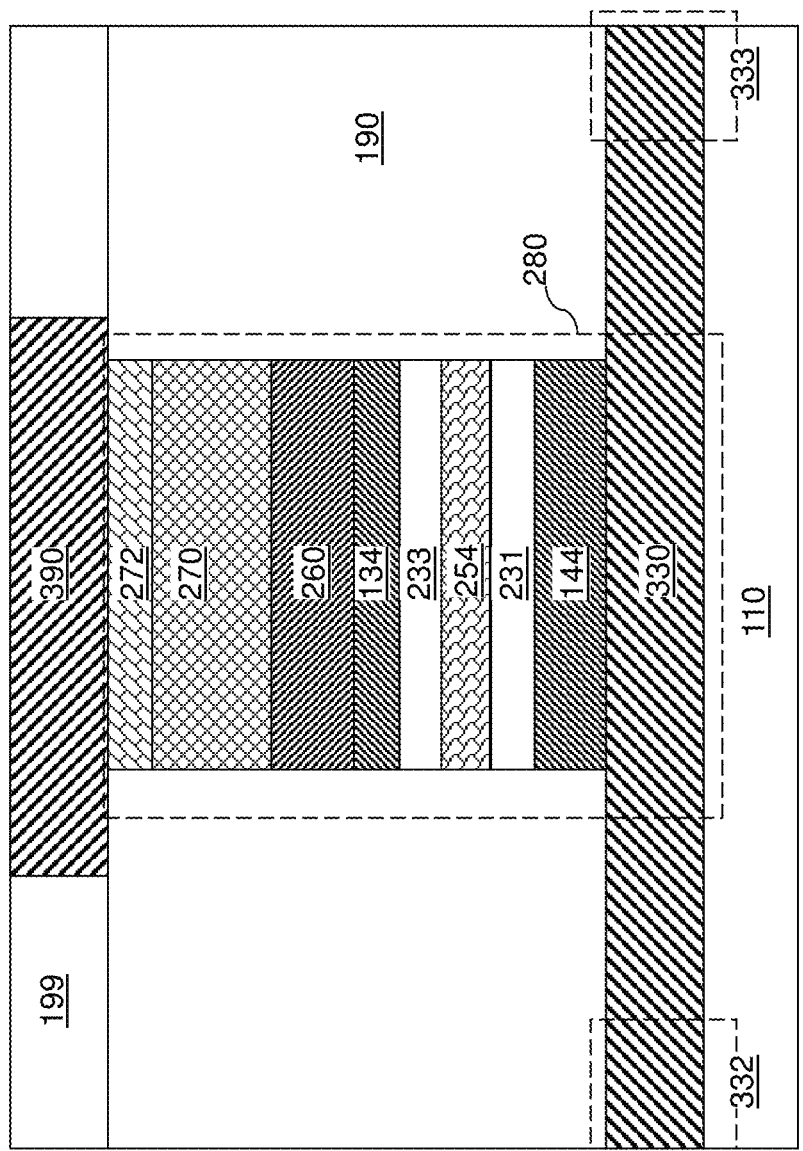
FIG. 6C is a vertical cross-sectional view of a third configuration of an exemplary spin-orbit-torque magnetoresistive memory device according to the third embodiment of the present disclosure.
Figure 6D:
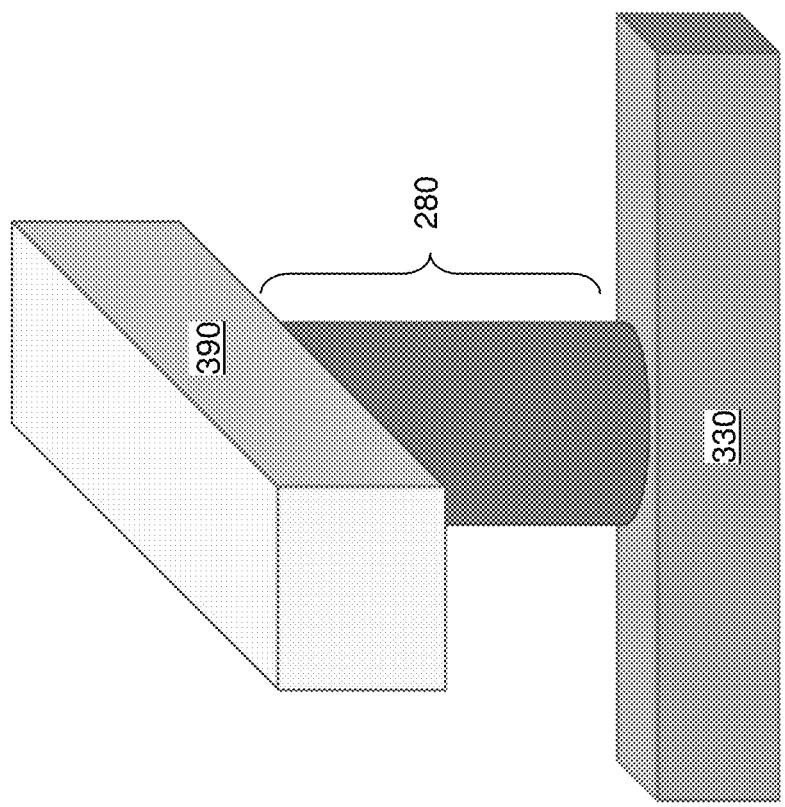
FIG. 6D is a perspective view of an exemplary spin-orbit-torque magnetoresistive memory device according to the third embodiment of the present disclosure.

FIGS. 6A-6C illustrate vertical cross-sectional view of various configurations of an exemplary magnetoresistive memory device 280 according to a third embodiment of the present disclosure. FIG. 6D is a perspective view of the exemplary spin-orbit-torque magnetoresistive memory device 280 of an embodiment of the present disclosure. The exemplary magnetoresistive memory device 280 can be a spin-orbit-torque (SOT) magnetoresistive memory device 280. The SOT magnetoresistive memory device 280 can include a magnetic tunnel junction comprising the free layer 144, a first tunneling dielectric layer 231, a metallic quantum well layer that comprises an additional ferromagnetic reference layer 154 or a nonmagnetic metallic quantum well layer 254, a second tunneling dielectric layer 233, a ferromagnetic reference layer 134, a first electrode 270, and a spin Hall effect metal line 330 contacting a surface of the free layer 144 and extending along a direction that is parallel to the surface of the free layer 144. Respective first and second electrical contacts (332, 333) electrically contact respective first and second end of the spin Hall effect metal line 330. The electrical contacts (332, 333) can be configured for flowing a programming electrical current therethrough. For example, the electrical contacts (332, 333) can be connected to output nodes of a programming circuit. The spin Hall effect metal line 330 can comprise a first electrically conductive line. The first electrode 270 can be electrically connected to a second electrically conductive line 390 which is connected to an output node of a sensing (i.e., reading) circuit. The reading current flows through the first electrically conductive line 390. The reading current flows through the SOT magnetoresistive memory device 280 between the second electrically conductive line 390 and one of the electrical contacts (332, 333). A SAF structure 260 or a hard magnetization layer can be optionally provided between the first electrode 270 and the reference layer 134. A metallic cap layer 272 can be optionally provided between the first electrode 270 and the second electrically conductive line 390.

The spin Hall effect metal line 330 can be formed on a lower-level dielectric layer 110. Generally, the spin Hall effect metal line 330 is configured to provide torque to the free layer 144 to assist switching of the magnetization direction of the respective free layer 144 during programming. The spin Hall effect metal lines 330 can comprise, and/or consist essentially of, at least one heavy elemental metal to maximize spin transfer across the interface between the free layer 144 and the spin Hall effect metal lines 330. In one embodiment, the elemental metal can have an atomic number in a range from, and including, 72 to, and including, 79. For example, the at least one elemental metal can include one or more of Hf, Ta, W, Re, Os, Ir, Pt, or Au. In one embodiment, the spin Hall effect metal lines 330 can comprise, and/or consist essentially of, beta phase tungsten, beta phase tantalum or platinum. In other words, in an embodiment, the spin Hall effect metal line 330 is made of an elemental metal which is undoped and unalloyed other than unavoidable impurities that are introduced during manufacturing at trace levels. In one embodiment, the spin Hall effect metal line 330 contacts a horizontal surface of the free layer.

The free layer 144 can have the same material composition and the same thickness range as in the previously described embodiments. The free layer 144 can have a parallel state in which the magnetization direction of the free layer 144 is parallel to the fixed magnetization direction of the reference layer 134, and an antiparallel state in which the magnetization direction of the free layer 144 is antiparallel to the fixed magnetization direction of the reference layer 134.

The first and second tunneling dielectric layers (231, 233) may have the same thickness range and the same material composition as the first and second tunneling dielectric layers (231, 233) of the magnetoresistive memory devices 180 of FIGS. 5A-5B.

The metallic quantum well layer (154 or 254) has a thickness that is thin enough to quantize the energy levels within the layer. For example, this layer can have a thickness in a range from 0.5 nm to 2 nm, such as 0.8 to 1.2 nm although greater thicknesses may also be employed. Thus, the metallic quantum well layer has discrete energy states.

In one embodiment shown in FIG. 6A, the SOT magnetoresistive memory device 280 includes two ferromagnetic reference layers (134, 154). The first reference layer 134 is located between the SAF structure 260 and the second tunneling dielectric layer 233. The second reference layer 154 comprises the metallic quantum well layer located between the two tunneling dielectric layers (231, 233).

In another embodiment shown in FIG. 6B, at least one additional tunneling dielectric layer 235 may be formed. The SOT magnetoresistive memory device 280 includes two ferromagnetic reference layers (134, 154) and three tunneling dielectric layers (231, 233, 235) which are described above with respect to FIGS. 4A and 4B. In this embodiment, both the first and the second reference layers (134, 154) comprise metallic quantum well layers which are located between respective tunneling dielectric layers.

In yet another embodiment shown in FIG. 6C, the second reference layer 154 of FIG. 6B is replaced with a nonmagnetic metallic quantum well layer 254. Each additional nonmagnetic metallic quantum well layer 254 may have the same thickness range and the same material composition as any of the nonmagnetic metallic quantum well layer 254 described above.

The first electrode 270 may have the same material composition and the same thickness range as the second electrode 170 of FIGS. 4A, 4B, and 5A-5B. The metallic cap layer 272 may have the same material composition and the same thickness as the metallic cap layer 172 of FIGS. 4A, 4B, and 5A-5B.

Figure 7:
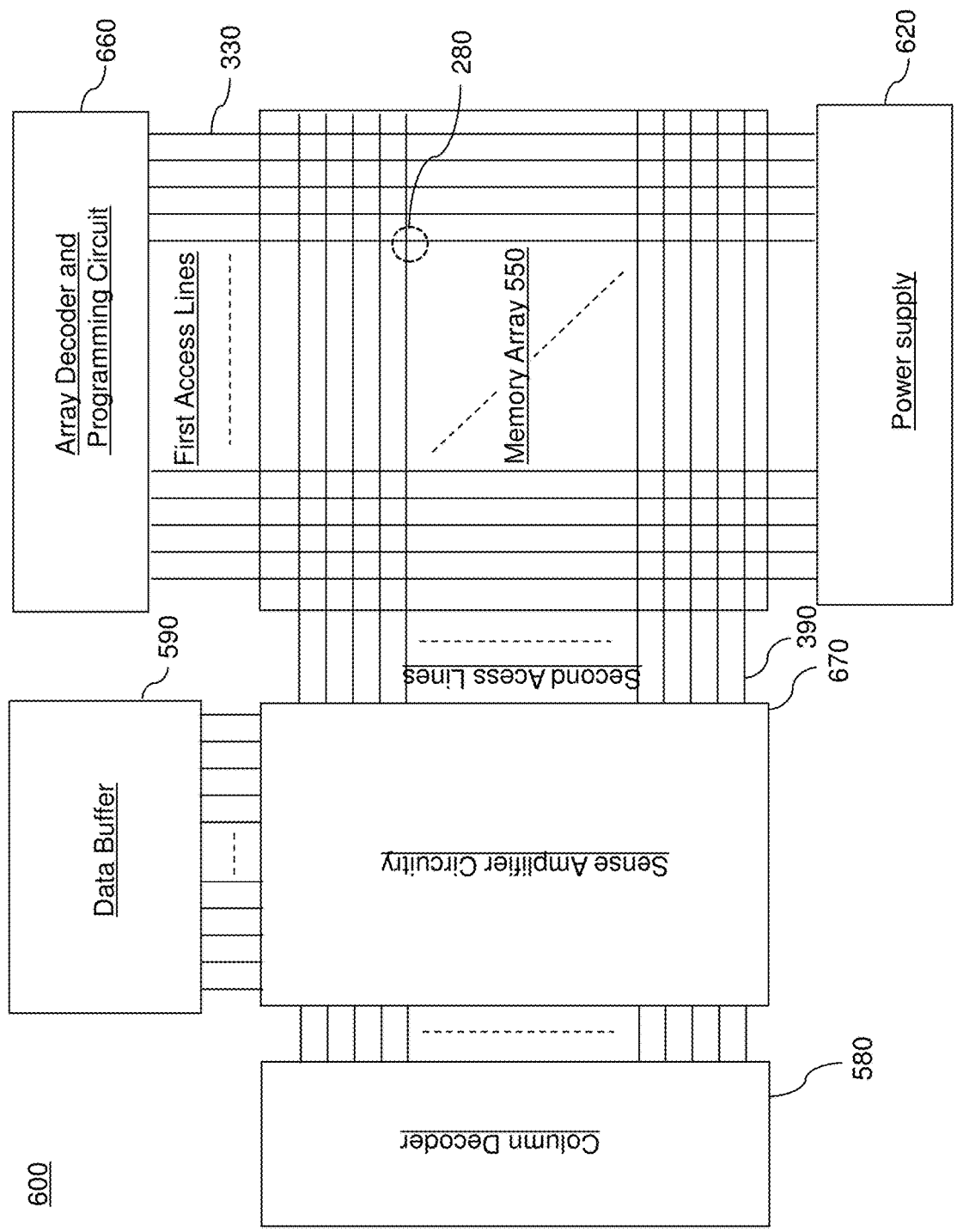
FIG. 7 is a schematic diagram of another random access memory array of magnetic tunnel junction devices according to the third embodiment of the present disclosure.

The illustrated magnetoresistive memory device 280 of FIGS. 6A-6D may be employed as a magnetoresistive memory device 280 within the array of magnetoresistive memory devices 180 illustrated in FIG. 7. FIG. 7 illustrates a magnetoresistive random access memory (MRAM) device 600 including a two-dimensional array of magnetoresistive memory devices 280, which may be derived from the MRAM device 501 of FIG. 1 by altering addressing schematics from the two terminal magnetoresistive memory devices 180 to the three terminal SOT magnetoresistive memory devices 280. The random access memory device 600 may comprise an MRAM device. The device 600 includes a memory array region 550 containing an array of respective magnetic devices, such as magnetic tunnel junction devices (e.g., SOT magnetoresistive memory cells) 280 located at intersections first access lines (which may comprise first electrically conductive lines 330 as illustrated or as second electrically conductive lines 390 in an alternate configuration) and second access lines (which may comprise second electrically conductive lines 390 as illustrated or as first electrically conductive lines 330 in an alternate configuration). Each first access line 330 may be a spin Hall effect metal line 330 described above. Each second electrically conductive line 390 can be electrically connected to a first electrode 270 of a respective magnetic tunnel junction device 280. Each first access line (i.e., each spin Hall effect metal line 330) may have a first electrical contact 332 electrically connected to one of the array decoder and programming circuit 660 or the power supply 620, and a second electrical contact 333 electrically connected to the other of the array decoder and programming circuit 660 and the power supply 620. Thus, electrical current through each spin Hall effect metal line 330 can be individually controlled.

The random access memory device 600 may also contain a sensing circuit 670 (which may include sense amplifiers and control circuits) connected to the second access lines, i.e., the second electrically conductive lines 390. A column decoder 580 and a data buffer 590 may be connected to the sense circuitry. The magnetoresistive memory devices 280 are provided in an array configuration that forms the random access memory device 600. In one embodiment, the magnetoresistive memory devices 280 may be provided as a rectangular array. It should be noted that the location and interconnection of elements are schematic, and the elements may be arranged in a different configuration. Further, a magnetoresistive memory device 280 may be manufactured as a discrete device, i.e., a single isolated device.

The random access configuration illustrated in the random access memory device 600 is only exemplary, and the magnetoresistive memory devices 280 of the embodiments of the present disclosure can be connected in different interconnection configurations.

According to the third embodiment of the present disclosure illustrated in FIGS. 6A-6D, a spin-orbit-torque (SOT) magnetoresistive memory device 280 comprises a magnetic tunnel junction comprising, from one side to another, a ferromagnetic free layer 144, a first tunneling dielectric layer 231, a metallic quantum well layer (154, 254), a second tunneling dielectric layer 233, and ferromagnetic reference layer 134. A first electrode 270 is located on the reference layer 134 side the magnetic tunnel junction. A spin Hall effect metal line 330 contacts a surface of the free layer 144, a first electrical contact 332 electrically contacts a first end of the spin Hall effect metal line 330, and a second electrical contact 330 electrically contacts a second end of the spin Hall effect metal line 330.

In one embodiment, the device 600 can comprise a programming circuit 660 configured to flow a programming current through the spin Hall effect metal line 330 between electrical contacts 332 and 333 and sensing circuit 670 configured to flow a measurement current through the device 280. In one embodiment, the energy levels of the various material layers can have the configuration illustrated in FIGS. 2A and 2B.

In the embodiments illustrated in FIGS. 6A and 6B, the metallic quantum well layer comprises an additional ferromagnetic reference layer 154. In another embodiment illustrated in FIG. 6C, the metallic quantum well layer comprises a nonmagnetic metal layer 254.

In one embodiment, each of the first tunneling dielectric layer 231 and the second tunneling dielectric layer 233 is thicker than the metallic quantum well layer (154, 254).

In one embodiment, the free layer 144 has two stable magnetization states which comprise a parallel state having a parallel magnetization direction that is parallel to a fixed magnetization direction of the reference layer 134, and an antiparallel state having an antiparallel magnetization direction that is antiparallel to the fixed magnetization direction of the reference layer 134, an energy level of one of the parallel state and the antiparallel state of the free layer 144 is within 0.1 eV of a discrete energy level of the metallic quantum well layer (154, 254), and an energy level of an additional one of the parallel state and the antiparallel state of the free layer 144 is offset from each discrete energy level of the metallic quantum well layer (154, 254) at least by 0.1 eV.

In the embodiment of FIG. 6B, the reference layer 134 comprises an additional metallic quantum well layer, and the device 280 comprises and an additional tunneling dielectric layer 235 located between the second tunneling dielectric layer 233 and the first electrode 270. wherein a discrete energy level within the additional metallic quantum well layer is within 0.1 eV of the discrete energy level of the metallic quantum well layer.

In one embodiment, a synthetic antiferromagnetic structure 260 is located between the first electrode 270 and the reference layer 134. In one embodiment, the metallic quantum well layer (154, 254) has an average thickness in a range from 0.3 nm to 2 nm.

In one embodiment, the free layer 144 comprises a respective ferromagnetic material in which a total atomic percentage of Fe, Co, Ni, and B is at least 80%. In another embodiment, the free layer 144 comprises a Heusler alloy. In one embodiment, each of the first tunneling dielectric layer 231 and the second tunneling dielectric layer 233 comprises magnesium oxide. In another embodiment, at least one of the first tunneling dielectric layer 231 and the second tunneling 233 dielectric layer comprises $MgAl_2O_4$. In one embodiment, the spin Hall effect metal line 330 comprises Hf, Ta, W, Re, Os, Ir, Pt, or Au.

In the embodiment illustrated in FIG. 7, a spin-obit-torque (SOT) magnetoresistive random access memory (MRAM) device 600 comprises a two-dimensional array of instances of the SOT magnetoresistive memory device 280, first access lines comprising a respective instance of the spin Hall effect metal lines 330 of the two-dimensional array, and second access lines 390 electrically connecting a respective subset of the first electrodes 270 of the two-dimensional array.

A method of operating the SOT magnetoresistive memory device 280 comprises applying a programming current between the first and the second electrical contacts (332, 333), and a reading (i.e., sensing) current between the first electrode 270 and one of the first or the second electrical contacts (332, 333).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A magnetoresistive memory device, comprising:
  a voltage controlled exchange coupling layer stack comprising a perpendicular magnetic anisotropy (PMA) ferromagnetic layer having a fixed magnetization direction, a ferromagnetic free layer, and an electrically conductive nonmagnetic interlayer exchange coupling layer located between the free layer and the PMA ferromagnetic layer and providing voltage dependent exchange coupling between the ferromagnetic free layer and the PMA ferromagnetic layer;

a magnetic tunnel junction comprising a ferromagnetic reference layer, a first tunneling dielectric layer, a second tunneling dielectric layer, and a metallic quantum well layer located between the first and the second tunneling dielectric layers, wherein the magnetic tunnel junction also includes the ferromagnetic free layer;

a first electrode located on a first side of a combination of the voltage controlled exchange coupling layer stack and the magnetic tunnel junction; and a second electrode located on a second side of the combination of the voltage controlled exchange coupling layer stack and the magnetic tunnel junction.

2. The magnetoresistive memory device of claim 1, wherein the ferromagnetic free layer has two stable magnetization states which comprise:

a parallel state having a parallel magnetization direction that is parallel to the fixed magnetization direction; and an antiparallel state having an antiparallel magnetization direction that is antiparallel to the fixed magnetization direction.

3. The magnetoresistive memory device of claim 2, wherein:

an energy level of one of the parallel state and the antiparallel state of the ferromagnetic free layer is within 0.1 eV from a discrete energy level of the metallic quantum well layer; and an energy level of another of the parallel state and the antiparallel state of the ferromagnetic free layer is offset from each discrete energy level of the metallic quantum well layer by at least by 0.1 eV.

4. The magnetoresistive memory device of claim 1, wherein the metallic quantum well layer comprises a nonmagnetic metallic quantum well layer.

5. The magnetoresistive memory device of claim 1, wherein the metallic quantum well layer comprises a ferromagnetic quantum well layer.

6. The magnetoresistive memory device of claim 1, wherein at least one of the first or second tunneling dielectric layers is thicker than the metallic quantum well layer.

7. The magnetoresistive memory device of claim 6, wherein each of the first and the second tunneling dielectric layers is at least 50% thicker than the metallic quantum well layer.

8. The magnetoresistive memory device of claim 6, wherein each of the first and the second tunneling dielectric layers is at least two times thicker than the metallic quantum well layer.

9. The magnetoresistive memory device of claim 1, each of the first and the second tunneling dielectric layers comprises magnesium oxide or $MgAl_2O_4$.

10. The magnetoresistive memory device of claim 1, wherein the metallic quantum well layer has an average thickness in a range from 0.3 nm to 2 nm.

11. The magnetoresistive memory device of claim 2, wherein energy levels of the parallel state and the antiparallel state of the ferromagnetic free layer shift in opposite directions upon application of voltages of different polarities between the first electrode and second electrode due to voltage-controlled exchange coupling with the PMA ferromagnetic layer.

12. The magnetoresistive memory device of claim 1, wherein the PMA ferromagnetic layer has greater perpendicular magnetic anisotropy than the ferromagnetic free layer.

13. The magnetoresistive memory device of claim 1, wherein the nonmagnetic interlayer exchange coupling layer has an exchange coupling coefficient having a magnitude in a range from $1\times10^{-7}$ erg/(V·cm) to $4\times10^{-6}$ erg/(V·cm) within a voltage range from −10 V to 10 V.

14. The magnetoresistive memory device of claim 1, wherein the nonmagnetic interlayer exchange coupling layer consists essentially of at least one metallic element selected from Au, Cu, Cr or Al.

15. The magnetoresistive memory device of claim 1, wherein the PMA ferromagnetic layer comprises a material selected from a FePt alloy, a FePd alloy, a CoPt alloy, a Pt/Co multilayer stack, a Co/Ag multilayer stack, a Co/Cu multilayer stack, a Co/Ni multilayer stack, a (Pt/Co/Pt)/Pd multilayer stack, a (Pt/Co/Pt)/Ag multilayer stack, a (Pt/Co/Pt)/Cu multilayer stack, a (Pt/Co/Pt)/Ni multilayer stack, or a Co/(Pt/Pd) multilayer stack.

16. The magnetoresistive memory device of claim 1, further comprising a programming circuitry configured to apply a programming voltage selected from a positive voltage pulse and a negative voltage pulse across the first electrode and the second electrode to induce than the ferromagnetic free layer to transition into a target magnetization state.

17. The magnetoresistive memory device of claim 16, further comprising a sense circuitry configured to apply a sense voltage pulse of a fixed polarity between the first electrode and the second electrode, wherein a magnitude of the sense voltage pulse is less than a voltage magnitude required to switch the magnetization state of than the ferromagnetic free layer.

18. A magnetoresistive random access memory comprising:

a two-dimensional array of instances of the magnetoresistive memory device of claim 1;

word lines electrically connecting a respective subset of the first electrodes of the two-dimensional array;

bit lines electrically connecting a respective subset of the second electrodes of the two-dimensional array; and a programming and sensing circuitry connected to the bit lines.

19. A method of operating the magnetoresistive memory device of claim 1, comprising:

applying a first polarity programming voltage to the first electrode relative to the second electrode in a first programming step to switch a magnetization of than the ferromagnetic free layer from a parallel state to an antiparallel state with respect to the fixed magnetization direction; and applying a second polarity programming voltage having a polarity that is opposite to the first polarity programming voltage to the first electrode relative to the second electrode in a second programming step to switch the magnetization of than the ferromagnetic free layer from the antiparallel state to the parallel state with respect to the fixed magnetization direction.

20. The method of claim 19, further comprising applying a sense voltage pulse of a fixed polarity between the first electrode and the second electrode, wherein a magnitude of the sense voltage pulse is less than a voltage magnitude required to switch the magnetization of than the ferromagnetic free layer.

* * * * *